US012253943B2

(12) United States Patent
Keeth et al.

(10) Patent No.: US 12,253,943 B2
(45) Date of Patent: *Mar. 18, 2025

(54) MEMORY DEVICE INTERFACE AND METHOD

(71) Applicant: Lodestar Licensing Group, LLC., Evanston, IL (US)

(72) Inventors: Brent Keeth, Boise, ID (US); Owen Fay, Meridian, ID (US); Chan H. Yoo, Boise, ID (US); Roy E. Greeff, Boise, ID (US); Matthew B. Leslie, Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/537,357

(22) Filed: Dec. 12, 2023

(65) Prior Publication Data

US 2024/0111673 A1 Apr. 4, 2024

Related U.S. Application Data

(63) Continuation of application No. 17/861,627, filed on Jul. 11, 2022, now Pat. No. 11,868,253, which is a
(Continued)

(51) Int. Cl.
*G11C 11/00* (2006.01)
*G06F 12/02* (2006.01)
(Continued)

(52) U.S. Cl.
CPC ...... *G06F 12/0653* (2013.01); *G06F 12/0215* (2013.01); *G11C 11/4093* (2013.01);
(Continued)

(58) Field of Classification Search
CPC . G06F 12/0215; G11C 11/4093; G11C 29/12; G11C 2211/4062
See application file for complete search history.

(56) References Cited

U.S. PATENT DOCUMENTS 6,226,738 B1   5/2001  Dowling
6,460,152 B1  10/2002  Demidov et al.
(Continued)

FOREIGN PATENT DOCUMENTS

CN   113728383 A   11/2021
CN   113767435 A   12/2021
(Continued)

OTHER PUBLICATIONS

"European Application Serial No. 20758657.9, Response Filed Apr. 11, 2022 to Communication Pursuant to Rules 161 (2) and 162 EPC mailed Oct. 1, 2021", 9 pgs.
(Continued)

*Primary Examiner* — Pho M Luu
(74) *Attorney, Agent, or Firm* — Fletcher Yoder, P.C.

(57) ABSTRACT

Apparatus and methods are described, including memory devices and systems. Memory devices, systems and methods may include a buffer interface to translate high speed data interactions on a host interface side into slower, wider data interactions on a DRAM interface side. The slower, and wider DRAM interface may be configured to substantially match the capacity of the narrower, higher speed host interface. In some cases, the buffer interface may be configured to provide multiple sub-channel interfaces each coupled to one or more regions within the memory structure and configured to facilitate data recovery in the event of a failure of some portion of the memory structure. Selected memory devices, systems and methods may include an individual DRAM die, or one or more stacks of DRAM dies coupled to a buffer die.

20 Claims, 14 Drawing Sheets

Related U.S. Application Data continuation of application No. 16/797,618, filed on Feb. 21, 2020, now Pat. No. 11,386,004.

(60) Provisional application No. 62/826,422, filed on Mar. 29, 2019, provisional application No. 62/816,731, filed on Mar. 11, 2019, provisional application No. 62/809,281, filed on Feb. 22, 2019.

(51) Int. Cl.

| | | |
|---|---|---|
| *G06F 12/06* | (2006.01) | |
| *G11C 11/4093* | (2006.01) | |
| *G11C 29/12* | (2006.01) | |
| *H01L 25/065* | (2023.01) | |
| *H01L 25/18* | (2023.01) | |

(52) U.S. Cl.
CPC .......... *G11C 29/12* (2013.01); *H01L 25/0652* (2013.01); *H01L 25/0657* (2013.01); *H01L 25/18* (2013.01); *G06F 2212/1016* (2013.01); *G11C 2211/4062* (2013.01); *H01L 2225/06506* (2013.01); *H01L 2225/0651* (2013.01); *H01L 2225/06513* (2013.01); *H01L 2225/06517* (2013.01); *H01L 2225/0652* (2013.01); *H01L 2225/06541* (2013.01); *H01L 2225/06562* (2013.01); *H01L 2225/06586* (2013.01)

(56) References Cited

U.S. PATENT DOCUMENTS

| | | | |
|---|---|---|---|
| 7,640,386 B2 | 12/2009 | Coteus et al. | |
| 7,717,752 B2 | 5/2010 | Loughner et al. | |
| 8,069,379 B2 | 11/2011 | Perego et al. | |
| 8,275,936 B1 | 9/2012 | Haywood et al. | |
| 8,543,758 B2 | 9/2013 | Larson et al. | |
| 8,754,533 B2 | 6/2014 | Or-Bach et al. | |
| 8,984,189 B2 | 3/2015 | Casper et al. | |
| 9,357,649 B2 | 5/2016 | Chun et al. | |
| 9,378,707 B2 | 6/2016 | Lee | |
| 9,391,048 B2 | 7/2016 | Lee | |
| 9,489,009 B2 | 11/2016 | Lee et al. | |
| 9,519,315 B2 | 12/2016 | Connolly | |
| 10,528,267 B2 | 1/2020 | Batra et al. | |
| 10,621,043 B2 | 4/2020 | Casper et al. | |
| 10,628,295 B2 | 4/2020 | Gu et al. | |
| 10,649,680 B2 | 5/2020 | Riley et al. | |
| 10,733,500 B2 | 8/2020 | Andreopoulos et al. | |
| 10,740,033 B2 | 8/2020 | Kim et al. | |
| 10,877,857 B2 | 12/2020 | Park | |
| 10,922,607 B2 | 2/2021 | Sengupta et al. | |
| 11,386,004 B2* | 7/2022 | Keeth ................. | G06F 12/0284 |
| 11,635,910 B2* | 4/2023 | Keeth ................. | G06F 11/1048 365/63 |
| 11,721,685 B2* | 8/2023 | Dungan .............. | H01L 25/0652 257/713 |
| 11,868,253 B2* | 1/2024 | Keeth ................. | G11C 11/4093 |
| 2004/0163028 A1 | 8/2004 | Olarig | |
| 2004/0233721 A1 | 11/2004 | Kim et al. | |
| 2006/0107186 A1 | 5/2006 | Cowell et al. | |
| 2006/0126369 A1 | 6/2006 | Raghuram | |
| 2006/0233012 A1 | 10/2006 | Sekiguchi et al. | |
| 2008/0109597 A1 | 5/2008 | Schakel et al. | |
| 2008/0123459 A1 | 5/2008 | Rajan et al. | |
| 2008/0136002 A1 | 6/2008 | Yang | |
| 2008/0144411 A1 | 6/2008 | Tsern | |
| 2008/0253199 A1 | 10/2008 | Torabi et al. | |
| 2009/0021874 A1 | 1/2009 | Divito et al. | |
| 2009/0103345 A1 | 4/2009 | McLaren et al. | |
| 2009/0248969 A1 | 10/2009 | Wu et al. | |
| 2010/0091537 A1 | 4/2010 | Scott et al. | |
| 2010/0309706 A1 | 12/2010 | Saito et al. | |
| 2012/0069034 A1 | 3/2012 | Biswas et al. | |
| 2012/0102292 A1 | 4/2012 | Rajan et al. | |
| 2012/0284436 A1 | 11/2012 | Casper et al. | |
| 2012/0311231 A1 | 12/2012 | Porterfield | |
| 2014/0358834 A1 | 12/2014 | Kim et al. | |
| 2015/0155876 A1 | 6/2015 | Jayasena et al. | |
| 2015/0355965 A1 | 12/2015 | Peddle | |
| 2016/0284424 A1 | 9/2016 | Das et al. | |
| 2016/0329303 A1 | 11/2016 | Ye et al. | |
| 2017/0194962 A1 | 7/2017 | Bains et al. | |
| 2017/0255552 A1 | 9/2017 | Chatterjee et al. | |
| 2017/0323875 A1 | 11/2017 | Tam | |
| 2017/0344051 A1 | 11/2017 | Patel | |
| 2018/0068217 A1 | 3/2018 | Eleftheriou et al. | |
| 2018/0102344 A1 | 4/2018 | Ramachandra et al. | |
| 2018/0174996 A1 | 6/2018 | Mostovoy et al. | |
| 2018/0225235 A1 | 8/2018 | Lee | |
| 2018/0309451 A1 | 10/2018 | Lu et al. | |
| 2019/0318230 A1 | 10/2019 | Cho et al. | |
| 2020/0272560 A1 | 8/2020 | Keeth et al. | |
| 2020/0272564 A1 | 8/2020 | Keeth et al. | |
| 2020/0279588 A1 | 9/2020 | Lym et al. | |
| 2021/0073616 A1 | 3/2021 | Moraitis et al. | |
| 2021/0157751 A1* | 5/2021 | Kwon ................... | G11C 5/025 |
| 2021/0200464 A1 | 7/2021 | Keeth | |
| 2021/0200699 A1 | 7/2021 | Keeth et al. | |
| 2021/0201966 A1 | 7/2021 | Gibbons et al. | |
| 2021/0318956 A1 | 10/2021 | Keeth et al. | |
| 2021/0406660 A1 | 12/2021 | Chen | |
| 2022/0121393 A1 | 4/2022 | Keeth | |

FOREIGN PATENT DOCUMENTS

| | | |
|---|---|---|
| JP | 2016522495 A | 7/2016 |
| KR | 100988388 B1 | 10/2010 |
| KR | 20170029074 A | 3/2017 |
| WO | 2020172551 A | 8/2020 |
| WO | 2020172557 A1 | 8/2020 |
| WO | 202138329 A1 | 7/2021 |
| WO | 2021133826 A1 | 7/2021 |
| WO | 2021138408 A1 | 7/2021 |
| WO | 2022087142 A1 | 4/2022 |

OTHER PUBLICATIONS

"European Application Serial No. 20759297.3, Response Filed Apr. 19, 2022 to Communication Pursuant to Rules 161 (2) and 162 EPC mailed Oct. 5, 2021", 9 pgs.

"International Application Serial No. PCT/US2020/019259, International Preliminary Report on Patentability mailed Sep. 2, 2021", 8 pgs.

"International Application Serial No. PCT/US2020/019259, International Search Report mailed Jun. 19, 2020", 6 pgs.

"International Application Serial No. PCT/US2020/019259, Written Opinion mailed Jun. 19, 2020", 6 pgs.

"International Application Serial No. PCT/US2020/019269, International Preliminary Report on Patentability mailed Sep. 2, 2021", 9 pgs.

"International Application Serial No. PCT/US2020/019269, International Search Report mailed Jun. 18, 2020", 4 pgs.

"International Application Serial No. PCT/US2020/019269, Written Opinion mailed Jun. 18, 2020", 7 pgs.

"International Application Serial No. PCT/US2020/066664, International Search Report mailed Apr. 8, 2021", 4 pgs.

"International Application Serial No. PCT/US2020/066664, Written Opinion mailed Apr. 8, 2021", 3 Pgs.

"International Application Serial No. PCT/US2020/067319, International Search Report mailed Apr. 19, 2021", 4 pgs.

"International Application Serial No. PCT/US2020/067319, Written Opinion mailed Apr. 19, 2021", 4 pgs.

"International Application Serial No. PCT/US2020/067447, International Search Report mailed Apr. 27, 2021", 3 pgs.

"International Application Serial No. PCT/US2020/067447, Written Opinion mailed Apr. 27, 2021", 4 Pgs.

"International Application Serial No. PCT/US2021/055866, International Search Report mailed Feb. 4, 2022", 4 pgs.

(56) References Cited

OTHER PUBLICATIONS

"International Application Serial No. PCT/US2021/055866, Written Opinion mailed Feb. 4, 2022", 4 pgs.
KR Notice of Final Rejection for KR Application No. 10-2021-7030535, Mailed May 17, 2024, 7 Pages.
EP Office Action for EP Application No. 20758657.9, Mailed Sep. 7, 2023, 7 pages.
KR 2nd Final Rejection for KR Application No. 10-2021-7030535, Mailed Sep. 12, 2024, 6 Pages.

* cited by examiner

MEMORY DEVICE INTERFACE AND METHOD

PRIORITY APPLICATIONS

This application is a continuation of U.S. application Ser. No. 17/861,627, now U.S. Pat. No. 11,868,253, filed Jul. 11, 2022, which is a continuation of U.S. application Ser. No. 16/797,618, now U.S. Pat. No. 11,386,004, filed Feb. 21, 2020, which claims the benefit of priority to U.S. Provisional Application Ser. No. 62/809,281, filed Feb. 22, 2019 and to U.S. Provisional Application Ser. No. 62/816,731, filed Mar. 11, 2019, and to U.S. Provisional Application Ser. No. 62/826,422, filed Mar. 29, 2019, all of which are incorporated herein by reference in their entirety.

BACKGROUND

The present description addresses relates generally to example structures and methods for a first memory interface to multiple respective second memory interfaces for interfacing with one or more memory devices; and more particularly relates to the memory systems including a buffer (in some examples, a buffer die or buffer assembly), operable to perform such reallocation. In some examples, the buffer can be configured to perform the reallocation to allow the second memory interfaces to be wider, and to operate at a slower data rate, than the first interface. The described buffer may be used in multiple configurations of memory interfaces, may be used with a variety of memory structures, including individual memory devices, any of multiple configurations of stacked memory devices, or other arrangements of multiple memory devices.

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

It is desirable to provide improved main memory, such as DRAM memory. Features of improved main memory that are desired include, but are not limited to, higher capacity, higher speed, and reduced cost.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
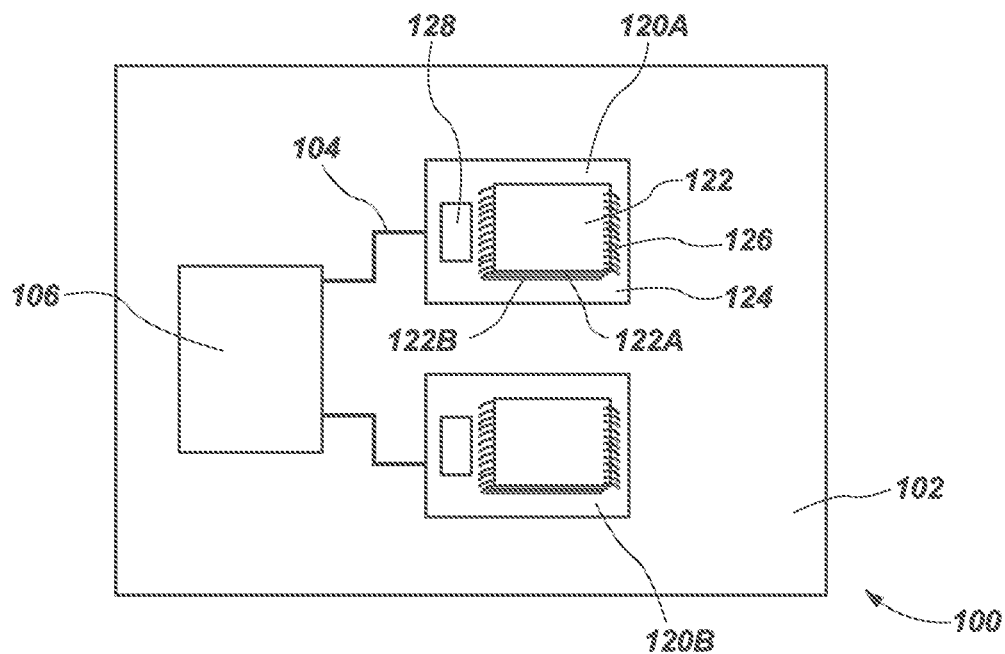
FIG. 1A illustrates a system including a memory device in accordance with some example embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Described below are various embodiments incorporating memory systems in which an external memory interface operates to transfer data at a first rate, but the memory operates internally at a second data rate slower than the first data rate. In examples described below, such operation can be achieved through use of a buffer interface in communication with the external memory interface (which may be, for example, a host interface), and redistributes the data connections (DQs) of the external interface to a greater number of data connections in communication with one or more memory devices (and/or one or more memory banks), which operate at a slower clock rate than that of the external memory interface.

In embodiments as described below, the buffer interface may be presented in a separate die sitting between a host (or other) interface and one or more memory die. In an example embodiment, a buffer die (or other form of buffer interface) may include a host physical interface including connections for at least one memory channel (or sub-channel), including command/address connections and data connections. Control logic in the buffer interface may be implemented to reallocate the connections for the memory channel to at least two (or more) memory sub-channels, which connections extend to DRAM physical interfaces for each sub-channel, each sub-channel physical interface including command/address connections and data connections. The DRAM physical interfaces for each sub-channel then connect with one or more memory die.

Also described below are stacked memory structures as may be used in one of the described memory systems, in which multiple memory die may be laterally offset from one another and connected either with another memory die, a logic die, or another structure/device, through wire bond connections. As described below, in some examples, one or more of the memory dies may include redistribution layers (RDLs) to distribute contact pads proximate an edge of the die to facilitate the described wire bonding.

In some embodiments, a buffer interface as described above may be used to reallocate a host (or other) interface including DQs, including data connections, multiple ECC connections, and multiple parity connections. In some such embodiments, the buffer interface may be used in combination with one or more memory devices configured to allocate the data, ECC, and parity connections within the memory device(s) in a manner to protect against failure within the portion of the memory array or data path associated with a respective DRAM physical interface, as discussed in more detail below. This failure protection can be implemented in a manner to improve reliability of the memory system in a manner generally analogous to techniques known to the industry as Chipkill (trademark of IBM), or Single Device Data Correction (SDDC) (trademark of Intel). Such failure protection can be implemented to recover from multi-bit errors, for example as those affecting a region of memory, such as a sub-array, or the data and/or control paths to the sub-array region (i.e., a sub-channel of memory), as will be apparent to persons skilled in the art having the benefit of the present disclosure.

FIG. 1A shows an electronic system 100, having a processor 106 coupled to a substrate 102. In some examples, substrate 102 can be a system motherboard, or in other examples, substrate 102 may couple to another substrate, such as a motherboard. Electronic system, 100 also includes first and second memory devices 120A, 120B. Memory devices 120A, 120B are also shown supported by substrate 102 adjacent to the processor 106 but are depicted, in an example configuration, coupled to a secondary substrate 124. In other examples, memory devices 120A, 120B can be coupled directly to the same substrate 102 as processor 106.

The memory devices 120A, 120B, each include a buffer assembly, here in the example form of a buffer die 128, coupled to a secondary substrate 124. Although the terminology "buffer die" is used herein for referencing the buffer assembly, any such "buffer die" described herein may be in the form of an assembly including, for example, one or more semiconductor die or other devices and/or other discrete components (whether or not packaged together) providing the described functionality. Thus, unless expressly indicated otherwise in a specific usage, the term "buffer die" as used herein refers equally to a "buffer assembly" and/or "buffer device." The memory devices 120A, 120B can be individual die, or in some cases may each include a respective stack of memory devices, in this example DRAM dies 122. For purposes of the present description, memory devices 120A, 120B will be described in an example configuration of stacked memory devices. Additionally, memory devices 120A, 120B will be described in one example configuration in which the devices are dynamic random access memory (DRAM) dies 122A, 122B are each coupled to the secondary substrate 124. Other types of memory devices may be used in place of DRAM, including, for example FeRAM, phase change memory (PCM), 3D XPoint™ memory, NAND memory, or NOR memory, or a combination thereof. In some cases, a single memory device may include one or more memory die that uses a first memory technology (e.g., DRAM) and a second memory die that uses a second memory technology (e.g., SRAM, FeRAM, etc.) different from the first memory technology.

The stack of DRAM dies 122 are shown in block diagram form in FIG. 1. Other figures in the following description shown greater detail of the stack of dies and various stacking configurations. In the example of FIG. 1A, a number of wire bonds 126 are shown coupled to the stack of DRAM dies 122. Additional circuitry (not shown) is included on or within the secondary substrate 124. The additional circuitry completes the connection between the stack of DRAM dies 122, through the wire bonds 126, to the buffer die 120. Selected examples may include through silicon vias (TSVs) instead of wire bonds 126 as will be described in more detail in subsequent figures.

Figure 1B:
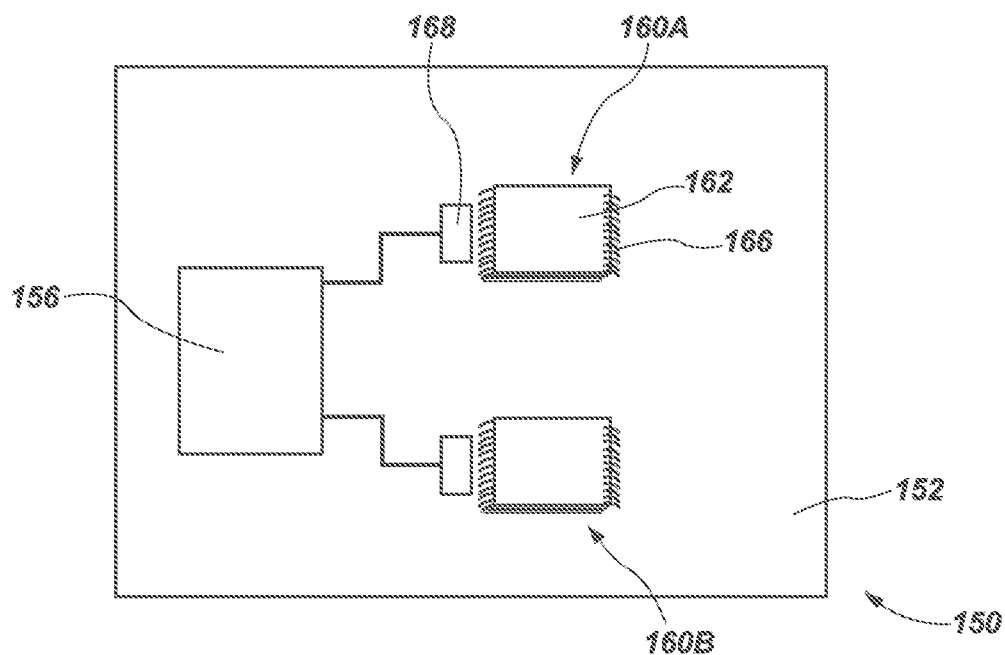
FIG. 1B illustrates another system including a memory device in accordance with some example embodiments.

Substrate wiring 104 is shown coupling the memory device 120A to the processor 106. In the example of FIG. 1B, an additional memory device 120B is shown. Although two memory devices 120A, 120B are shown for the depicted example, a, single memory structure may be used, or a number of memory devices greater than two may be used. Examples of memory devices as described in the present disclosure provide increased capacity near memory with increased speed and reduced manufacturing cost.

FIG. 1B shows an electronic system 150, having a processor 156 coupled to a substrate 152. The system 150 also includes first and second memory devices 160A, 160B. In contrast to FIG. 1A, in FIG. 1B, the first and second memory devices 160A, 160B are directly connected to the same substrate 102 as the processor 156, without any intermediary substrates or interposers. This configuration can provide additional speed and reduction in components over the example of FIG. 1A. Similar to the example of FIG. 1A, a buffer assembly or buffer die 168 is shown adjacent to a stack of DRAM dies 162. Wire bonds 166 are shown as an example interconnection structure, however other interconnection structures such as TSVs may be used.

Figure 2:
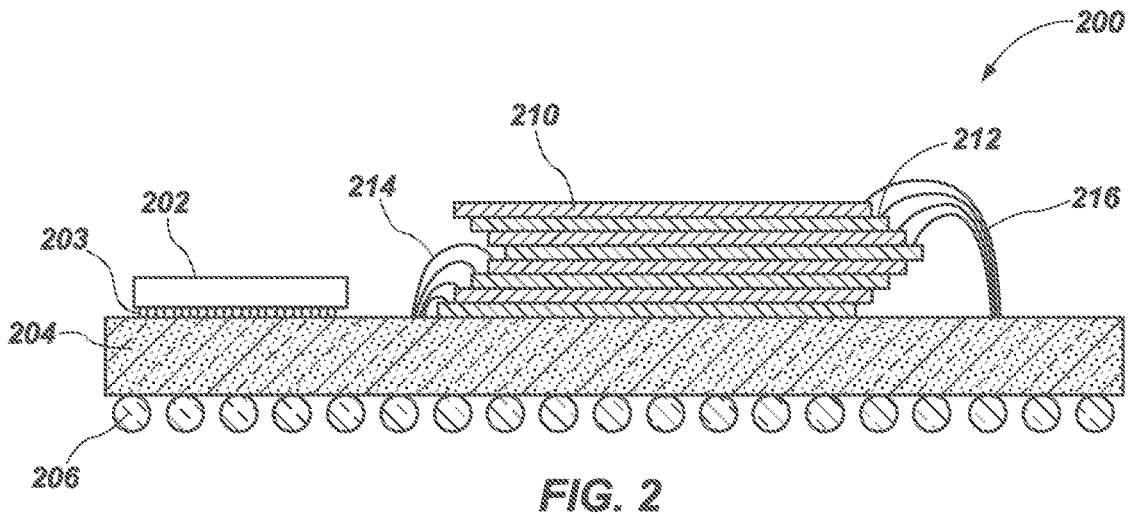
FIG. 2 illustrates an example memory device in accordance with some example embodiments.

FIG. 2 shows an electronic system 200 similar to memory device 118A or 118B from FIG. 1B. The electronic system 200 includes a buffer die 202 coupled to a substrate 204. The electronic system 200 also includes a stack of DRAM dies 210 coupled to the substrate 204. In the example of FIG. 2, the individual dies in the stack of DRAM dies 210 are laterally offset from one or more vertically adjacent die specifically, in the depicted example, each die is laterally offset from both vertically adjacent die. As an example, the die may be staggered in at least one stair step configuration. The Example of FIG. 2 shows two different stagger directions in the stair stepped stack of DRAM dies 210. In the illustrated dual stair step configuration, an exposed surface portion 212 of each die is used for a number of wire bond interconnections.

Multiple wire bond interconnections 214, 216 are shown from the dies in the stack of DRAM dies 210 to the substrate 204. Additional conductors (not shown) on or within the substrate 204 further couple the wire bond interconnections 214, 216 to the buffer die 202. The buffer die 202 is shown coupled to the substrate 204 using one or more solder interconnections 203, such as a solder ball array. A number of substrate solder interconnections 206 are further shown on a bottom side of the substrate 204 to further transmit signals and data from the buffer die into a substrate 102 and eventually to a processor 106 as shown in FIG. 1B.

Figure 3:
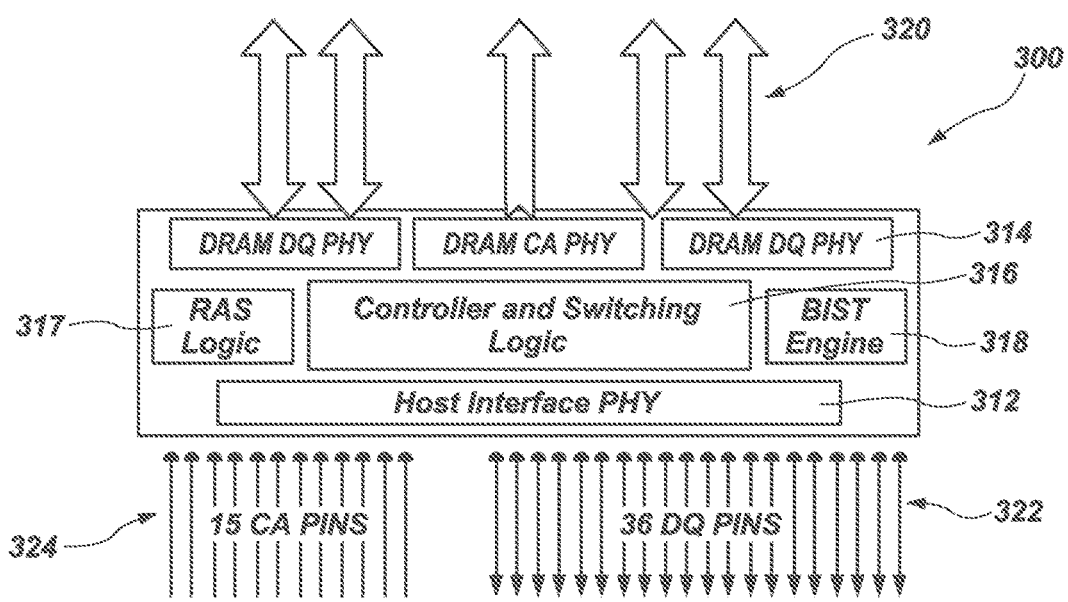
FIG. 3 illustrates a buffer die in block diagram form in accordance with some example embodiments.

FIG. 3 shows a block diagram of a buffer die 300 similar to buffer die 202 from FIG. 2. A host device interface 312 and a DRAM interface 314 are shown. Additional circuitry components of the buffer die 300 may include a controller and switching logic 316; reliability, availability, and serviceability (RAS) logic 317; and built-in self-test (BIST) logic 318. Communication from the buffer die 300 to a stack of DRAM dies is indicated by arrows 320. Communication from the buffer die 300 to a host device is indicated by arrows 322 and 324. In FIG. 3, arrows 324 denote communication from command/address (CA) pins, and arrows 322 denote communication from data (DQ) pins 322. Example numbers of CA pins and DQ pins are provided only as examples, as the host device interface may have substantially greater or fewer of either or both CA and DQ pins. The number of pins of either type required may vary depending upon the width of the channel of the interface, the provision for additional bits (for example ECC bits), among many other variables. In many examples, the host device interface will be an industry standard memory interface (either expressly defined by a standard-setting organization, or a de facto standard adopted in the industry).

In one example, all CA pins 324 act as a single channel, and all data pins 322 act as a single channel. In one example, all CA pins service all data pins 322. In another example, the CA pins 324 are subdivided into multiple sub-channels. In another example, the data pins 322 are subdivided into multiple sub-channels. One configuration may include a portion of the CA pins 324 servicing a portion of the data pins 322. In one specific example, 8 CA pins service 9 data (DQ) pins as a sub-combination of CA pins and data (DQ) pins. Multiple sub-combinations such as the 8 CA pin/9 data pin example, may be included in one memory device.

It is common in computing devices to have DRAM memory coupled to a substrate, such as a motherboard, using a socket, such as a dual in line memory (DIMM) socket. However, for some applications a physical layout of DRAM chips and socket connections on a DIMM device can take up a large amount of space. It is desirable to reduce an amount of space for DRAM memory. Additionally, communication through a socket interface is slower and less reliable than direct connection to a motherboard using solder connections. The additional component of the socket interface adds cost to the computing device.

Using examples of some example memory devices in the present disclosure, a physical size of a memory device can be reduced for a given DRAM memory capacity. Speed is improved due to the direct connection to the substrate, and cost is reduced by eliminating the socket component.

In operation, a possible data speed from a host device may be higher than interconnection components to DRAM dies such as trace lines, TSVs, wire bonds, etc. can handle. The addition of a buffer die 300 (or other form of buffer assembly) allows fast data interactions from a host device to be buffered. In the example of FIG. 3, the host interface 312 is configured to operate at a first data speed. In one example, the first data speed may match the speed that the host device is capable of delivering.

In one example, the DRAM interface 314 is configured to operate at a second data speed, slower than the first data speed. In one example, the DRAM interface 314 is configured to be both slower and wider than the host interface 312. In operation, the buffer die may translate high speed data interactions on the host interface 312 side into slower, wider data interactions on the DRAM interface 314 side. Additionally, as further described below, to maintain data throughput at least approximating that of the host interface, in some examples, the buffer assembly can reallocate the connections of the host interface to multiple memory sub-channels associated with respective DRAM interfaces. The slower, and wider DRAM interface 314 may be configured to substantially match the capacity of the narrower, higher speed host interface 312. In this way, more limited interconnection components to DRAM dies such as trace lines, TSVs, wire bonds, etc. are able to handle the capacity of interactions supplied from the faster host device. Though one example host interface (with both CA pins and DQ pins) to buffer die 300 is shown, buffer die 300 may include multiple host interfaces for separate data paths that are each mapped by buffer die 300 to multiple DRAM interfaces, in a similar manner.

In one example, the host device interface 312 includes a first number of data paths, and the DRAM interface 314 includes a second number of data paths greater than the first number of data paths. In one example, circuitry in the buffer die 300 maps data and commands from the first number of data paths to the second number of data paths. In such a configuration, the second number of data paths provide a slower and wider interface, as described above.

In one example the command/address pins 324 of the host device interface 312 include a first number of command/address paths, and on a corresponding DRAM interface 314 side of the buffer die 300, the DRAM interface 314 includes a second number of command/address paths that is larger than the first number of command/address paths. In one example, the second number of command/address paths is twice the first number of command/address paths. In one example, the second number of command/address paths is more than twice the first number of command/address paths. In one example, the second number of command/address paths is four times the first number of command/address paths. In one example, the second number of command/address paths is eight times the first number of command/address paths.

In one example, a given command/address path on the DRAM interface 314 side of the buffer die 300 is in communication with only a single DRAM die. In one example, a given command/address path on the DRAM interface 314 side of the buffer die 300 is in communication with multiple DRAM dies. In one example, a given command/address path on the DRAM interface 314 side of the buffer die 300 is in communication with 4 DRAM dies. In one example, a given command/address path on the DRAM interface 314 side of the buffer die 300 is in communication with 16 DRAM dies.

In one example the data pins 322 of the host device interface 312 include a first number of data paths, and on a corresponding DRAM interface 314 side of the buffer die 300, the DRAM interface 314 includes a second number of data paths that is larger than the first number of data paths. In one example, the second number of data paths is twice the first number of data paths. In one example, the second number of data paths is more than twice the first number of data paths. In one example, the second number of data paths is four times the first number of data paths. In one example, the second number of data paths is eight times the first number of data paths.

In one example, a data path on the DRAM interface 314 side of the buffer die 300 is in communication with only a single DRAM die. In one example, a given data path on the DRAM interface 314 side of the buffer die 300 is in communication with multiple DRAM dies. In one example, a given data path on the DRAM interface 314 side of the buffer die 300 is in communication with 4 DRAM dies. In one example, a given data path on the DRAM interface 314 side of the buffer die 300 is in communication with 16 DRAM dies.

In one example, the host interface 312 includes different speeds for command/address pins 324, and for data pins 322. In one example, data pins 322 of the host interface are configured to operate at 6.4 Gb/s. In one example, command/address pins 324 of the host interface are configured to operate at 3.2 Gb/s.

In one example, the DRAM interface 314 of the buffer die 300 slows down and widens the communications from the host interface 312 side of the buffer die 300. In one example, where a given command/address path from the host interface 312 is mapped to two command/address paths on the DRAM interface 314, a speed at the host interface is 3.2 Gb/s, and a speed at the DRAM interface 314 is 1.6 Gb/s.

In one example, where a given data path from the host interface 312 is mapped to two data paths on the DRAM interface 314, a speed at the host interface is 6.4 Gb/s, and a speed at the DRAM interface 314 is 3.2 Gb/s, where each data path is in communication with a single DRAM die in a stack of DRAM dies. In one example, where a given data path from the host interface 312 is mapped to four data paths on the DRAM interface 314, a speed at the host interface is 6.4 Gb/s, and a speed at the DRAM interface 314 is 1.6 Gb/s, where each data path is in communication with four DRAM dies in a stack of DRAM dies. In one example, where a given data path from the host interface 312 is mapped to eight data paths on the DRAM interface 314, a speed at the host interface is 6.4 Gb/s, and a speed at the DRAM interface 314 is 0.8 Gb/s, where each data path is in communication with 16 DRAM dies in a stack of DRAM dies.

In one example, a pulse amplitude modulation (PAM) protocol is used to communicate on the DRAM interface 314 side of the buffer die 300. In one example, the PAM protocol includes PAM-4, although other PAM protocols are within the scope of the invention. In one example, the PAM protocol increases the data bandwidth. In one example, where a given data path from the host interface 312 is mapped to four data paths on the DRAM interface 314, a speed at the host interface is 6.4 Gb/s, and a speed at the DRAM interface 314 is 0.8 Gb/s using a PAM protocol, where each data path is in communication with four DRAM dies in a stack of DRAM dies. In one example, where a given data path from the host interface 312 is mapped to eight data paths on the DRAM interface 314, a speed at the host interface is 6.4 Gb/s, and a speed at the DRAM interface 314 is 0.4 Gb/s using a PAM protocol, where each data path is in communication with 16 DRAM dies in a stack of DRAM dies.

A number of pins needed to communicate between the buffer die 300 and an example 16 DRAM dies varies depending on the number of command/address paths on the DRAM interface 314 side of the buffer die 300, and on the number of DRAM dies coupled to each data path. The following table show a number of non-limiting examples of pin counts and corresponding command/address path configurations.

| host CA paths | host speed (Gb/s) | DRAM CA paths | DRAM speed (Gb/s) | # dies coupled to DRAM path | # pins |
|---|---|---|---|---|---|
| 15 | 3.2 | 30 | 1.6 | 16 | 480 |
| 15 | 3.2 | 30 | 1.6 | 4 | 120 |
| 15 | 3.2 | 30 | 1.6 | 16 | 30 |
| 15 | 3.2 | 30 | 0.8 PAM-4 | 4 | 120 |
| 15 | 3.2 | 30 | 0.8 PAM-4 | 16 | 30 |

A number of pins needed to communicate between the buffer die 300 and an example 16 DRAM dies varies depending on the number of data paths on the DRAM interface 314 side of the buffer die 300, and on the number of DRAM dies coupled to each data path. The following table show a number of non-limiting examples of pin counts and corresponding data path configurations.

| host data paths | host speed (Gb/s) | DRAM data paths | DRAM speed (Gb/s) | # dies coupled to DRAM path | # pins |
|---|---|---|---|---|---|
| 36 | 6.4 | 72 | 3.2 | 1 | 1152 |
| 36 | 6.4 | 144 | 1.6 | 4 | 576 |
| 36 | 6.4 | 288 | 0.8 | 16 | 288 |
| 36 | 6.4 | 144 | 0.8 PAM-4 | 4 | 576 |
| 36 | 6.4 | 288 | 0.4 PAM-4 | 16 | 288 |

As illustrated in selected examples below, the number of pins in the above tables may be coupled to the DRAM dies in the stack of DRAM dies in a number of different ways. In one example, wire bonds are used to couple from the pins to the number of DRAM dies. In one example, TSVs are used to couple from the pins to the number of DRAM dies.

Although wire bonds and TSVs are used as an example, other communication pathways apart from wire bonds and TSVs are also within the scope of the present disclosure.

Figure 4:
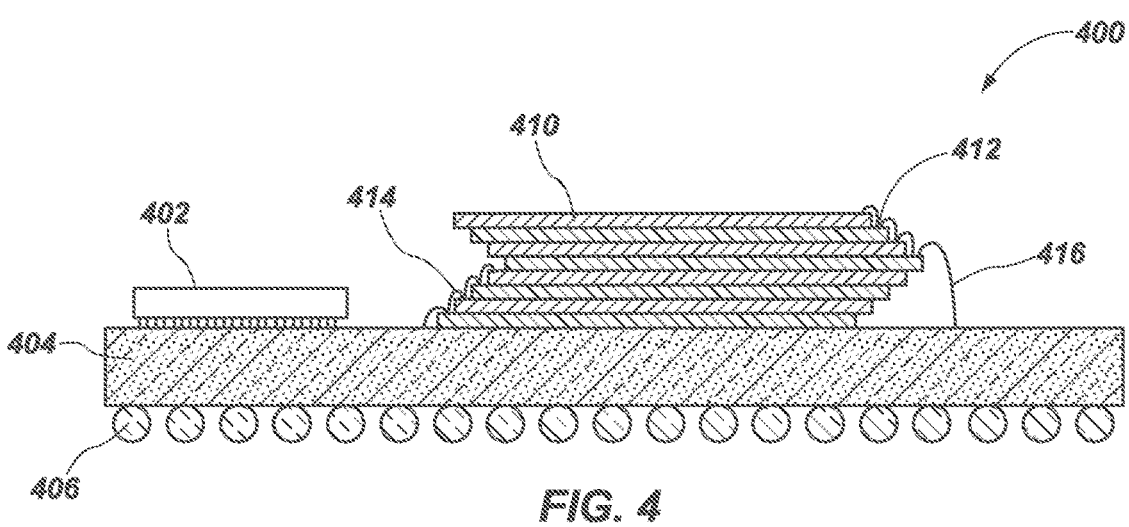
FIG. 4 illustrates another memory device in accordance with some example embodiments.

FIG. 4 shows another example of a memory device 400. The memory device 400 includes a buffer die 402 coupled to a substrate 404. The memory device 400 also includes a stack of DRAM dies 410 coupled to the substrate 404. In the example of FIG. 4, the stack of DRAM dies 410 are staggered in at least one stair step configuration. The Example of FIG. 4 shows two different stagger directions in the stair stepped stack of DRAM dies 410. Similar to the configuration of FIG. 2, in the illustrated stair step configuration, an exposed surface portion 412 is used for a number of wire bond interconnections.

Multiple wire bond interconnections 414, 416 are shown from the dies in the stack of DRAM dies 410 to the substrate 404. Additional conductors (not shown) on or within the substrate 404 further couple the wire bond interconnections 414, 416 to the buffer die 402. The buffer die 402 is shown coupled to the substrate 404 using one or more solder interconnections, such as a solder ball array. A number of substrate solder interconnections 406 are further shown on a bottom side of the substrate 404 to further transmit signals and data from the buffer die into a motherboard and eventually to a host device.

In the example of FIG. 4, the multiple wire bond interconnections 414, 416 are serially connected up the multiple stacked DRAM dies. In selected examples, a single wire bond may drive a load in more than one DRAM die. In such an example, the wire bond interconnections may be serially connected as shown in FIG. 4. In one example, a single wire bond may be serially connected to four DRAM dies. In one example, a single wire bond may be serially connected to eight DRAM dies. In one example, a single wire bond may be serially connected to sixteen DRAM dies. Other numbers of serially connected DRAM dies are also within the scope of the invention. Additionally, CA connections of the DRAM interface may be made to a first number of the DRAM dies, while the corresponding DQ connections of the DRAM interface may be made to a second number of the DRAM dies different from the first number.

Figure 5A:
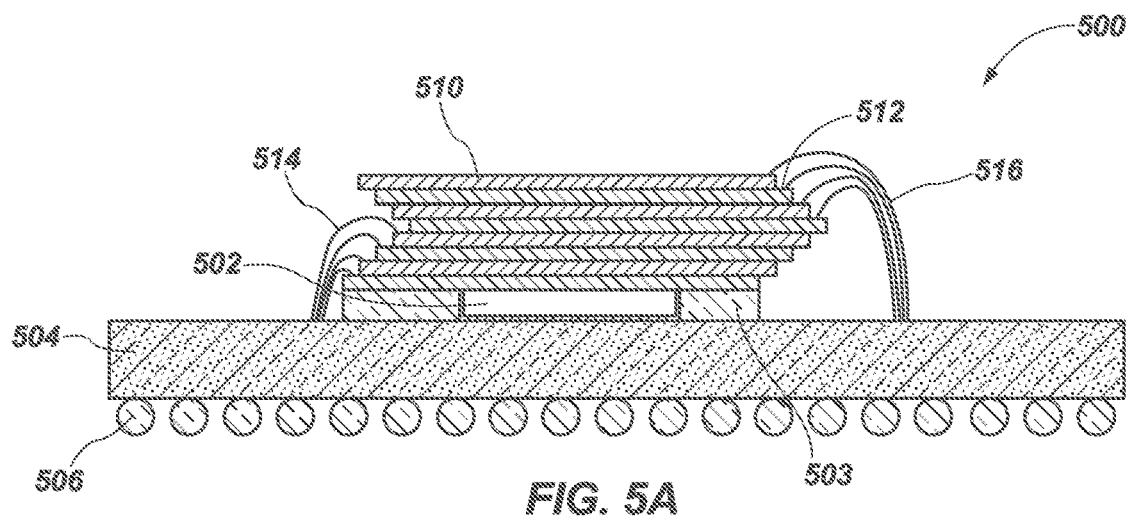
FIG. 5A illustrates another memory device in accordance with some example embodiments.

FIG. 5A shows another example of a memory device 500. The memory device 500 includes a buffer die 502 coupled to a substrate 504. The memory device 500 also includes a stack of DRAM dies 510 coupled to the substrate 504. In the example of FIG. 5A, the stack of DRAM dies 510 are staggered in at least one stair step configuration. The Example of FIG. 5 shows two different stagger directions in the stair stepped stack of DRAM dies 510. In the illustrated stair step configuration, an exposed surface portion 512 is used for a number of wire bond interconnections.

Multiple wire bond interconnections 514, 516 are shown from the dies in the stack of DRAM dies 410 to the substrate 404. Additional conductors (not shown) on or within the substrate 504 further couple the wire bond interconnections 514, 451616 to the buffer die 502. The buffer die 502 is shown coupled to the substrate 504 using one or more solder interconnections, such as a solder ball array. A number of substrate solder interconnections 506 are further shown on a bottom side of the substrate 504 to further transmit signals and data from the buffer die into a motherboard and eventually to a host device.

In the example of FIG. 5A, the buffer die 502 is located at least partially underneath the stack of DRAM dies 510. In one example, an encapsulant 503 at least partially surrounds the buffer die 502. The example of FIG. 5A further reduces an areal footprint of the memory device 500. Further, an interconnect distance between the stack of DRAM dies 510 and the buffer die 502 is reduced.

Figure 5B:
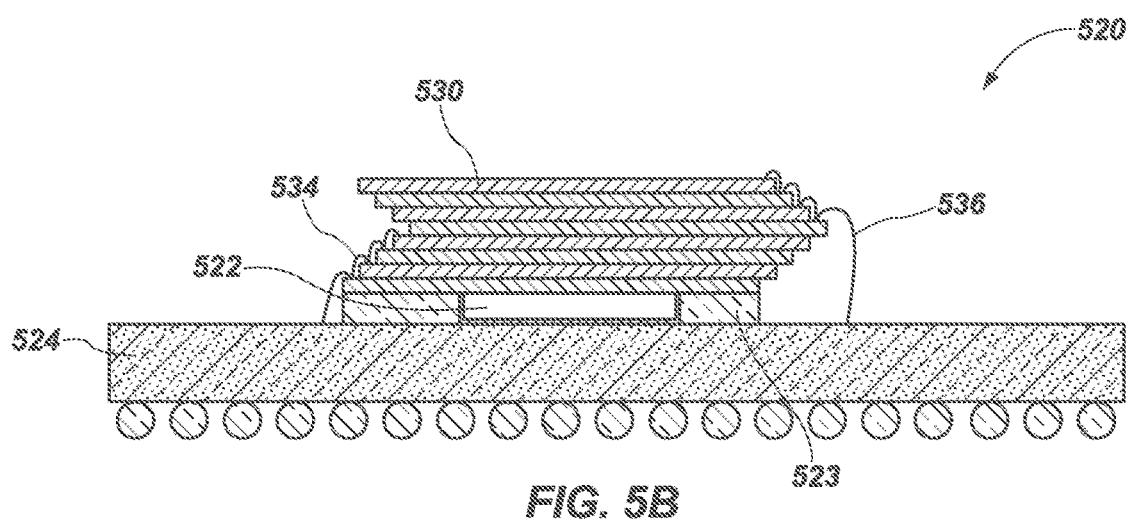
FIG. 5B illustrates another memory device in accordance with some example embodiments.

FIG. 5B shows another example of a memory device 520. The memory device 520 includes a buffer die 522 coupled to a substrate 524. The memory device 520 also includes a stack of DRAM dies 530 coupled to the substrate 524. Multiple wire bond interconnections 534, 536 are shown from the dies in the stack of DRAM dies 530 to the substrate 524. In the example of FIG. 5B, the multiple wire bond interconnections 534, 536 are serially connected up the multiple stacked DRAM dies. In one example, a single wire bond may be serially connected to four DRAM dies. In one example, a single wire bond may be serially connected to eight DRAM dies. In one example, a single wire bond may be serially connected to sixteen DRAM dies. Other numbers of serially connected DRAM dies are also within the scope of the invention.

Figures 5C, 5D:
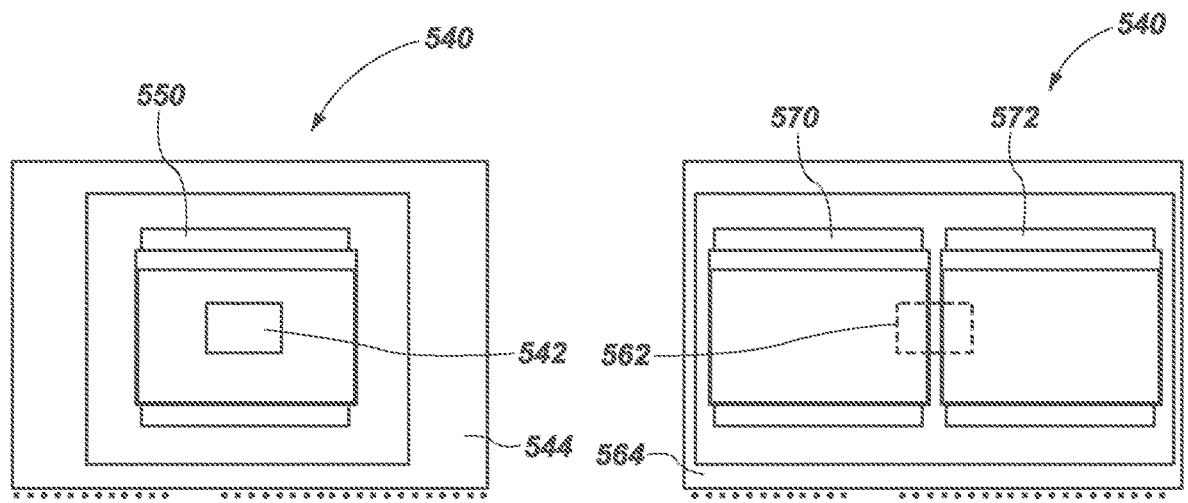
FIG. 5C illustrates another memory device in accordance with some example embodiments.
FIG. 5D illustrates another memory device in accordance with some example embodiments.

FIG. 5C shows a top view of a memory device 540 similar to memory devices 500 and 520. In the example of FIG. 5C, a buffer die 542 is shown coupled to a substrate 544, and located completely beneath a stack of DRAM dies 550. FIG. 5D shows a top view of a memory device 560 similar to memory devices 500 and 520. In FIG. 5D, a buffer die 562 is coupled to a substrate 564, and located partially underneath a portion of a first stack of DRAM dies 570 and a second stack of DRAM dies 572. In one example, a shorter stack of DRAM dies provides a shorter interconnection path, and a higher manufacturing yield. In selected examples, it may be desirable to use multiple shorter stacks of DRAM dies for these reasons. One tradeoff of multiple shorter stacks of DRAM dies is a larger areal footprint of the memory device 560.

Figure 6:
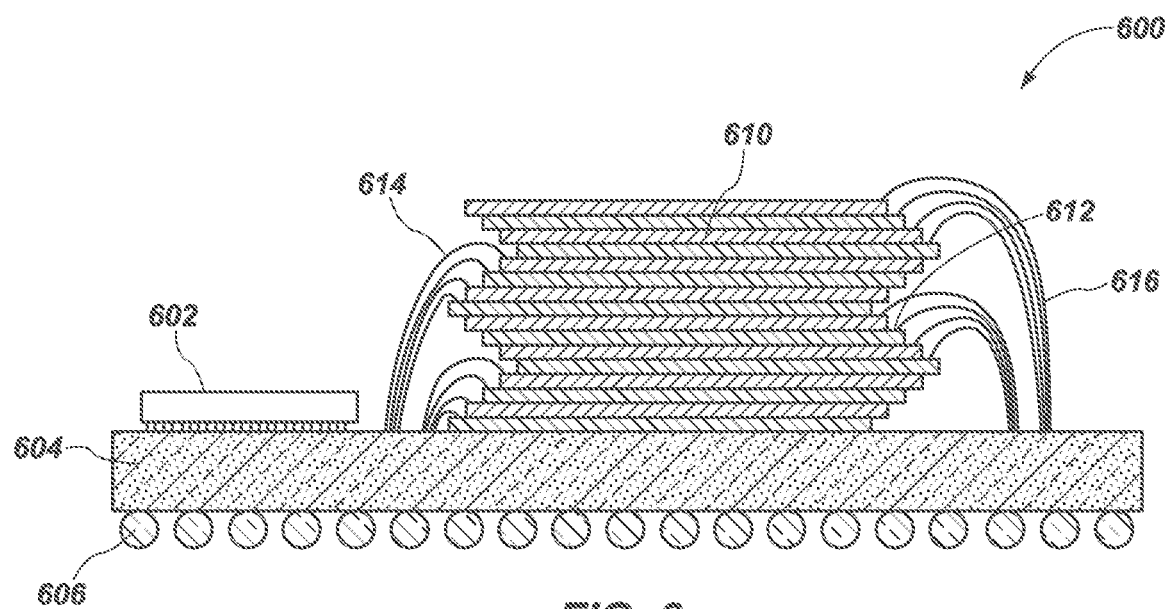
FIG. 6 illustrates another memory device in accordance with some example embodiments.

FIG. 6 shows another example of a memory device 600. The memory device 600 includes a buffer die 602 coupled to a substrate 604. The memory device 600 also includes a stack of DRAM dies 610 coupled to the substrate 604. In the example of FIG. 6, the stack of DRAM dies 610 are staggered in at least one stair step configuration. The Example of FIG. 6 shows four staggers, in two different stagger directions in the stair stepped stack of DRAM dies 610. The stack of DRAM dies 610 in FIG. 6 includes 16 DRAM dies, although the invention is not so limited. Similar to other stair step configurations shown, in FIG. 6, an exposed surface portion 612 is used for a number of wire bond interconnections.

Multiple wire bond interconnections 614, 616 are shown from the dies in the stack of DRAM dies 610 to the substrate 604. Additional conductors (not shown) on or within the substrate 604 further couple the wire bond interconnections 614, 616 to the buffer die 602. The buffer die 602 is shown coupled to the substrate 604 using one or more solder interconnections, such as a solder ball array. A number of substrate solder interconnections 606 are further shown on a bottom side of the substrate 604 to further transmit signals and data from the buffer die into a motherboard and eventually to a host device.

Figure 7:
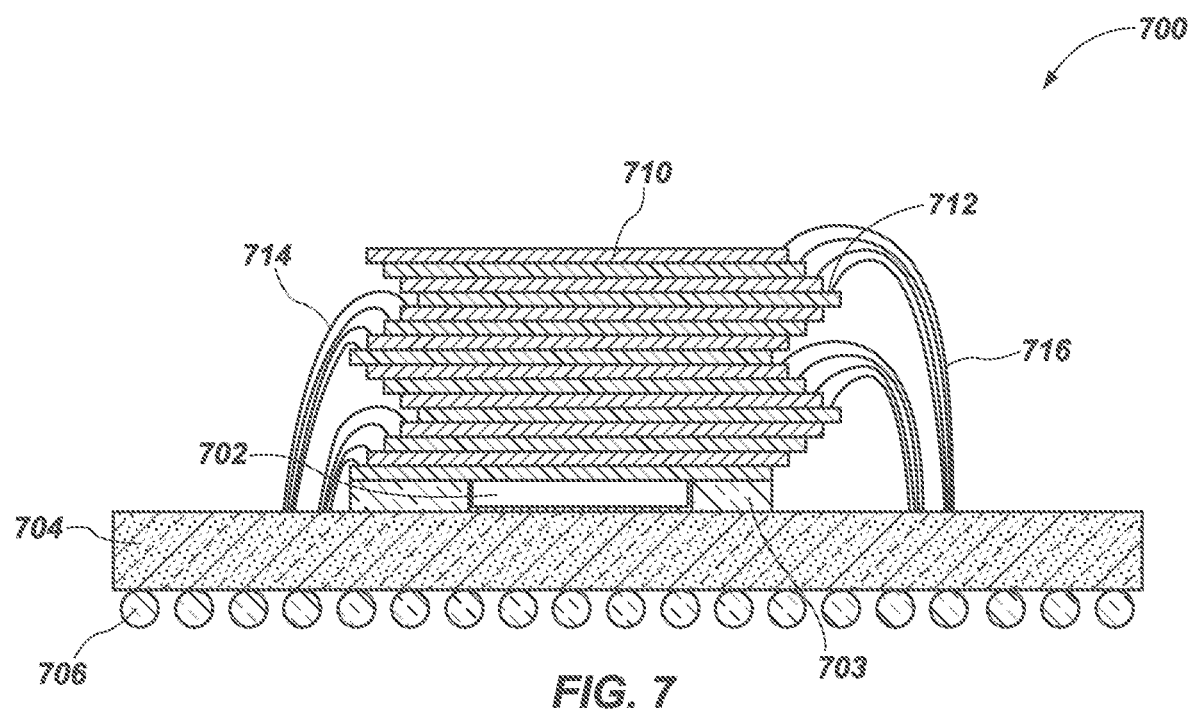
FIG. 7 illustrates another memory device in accordance with some example embodiments.

FIG. 7 shows another example of a memory device 700. The memory device 700 includes a buffer die 702 coupled to a substrate 704. The memory device 700 also includes a stack of DRAM dies 710 coupled to the substrate 704. In the example of FIG. 7, the stack of DRAM dies 710 are staggered in at least one stair step configuration. The Example of FIG. 7 shows four staggers, in two different stagger directions in the stair stepped stack of DRAM dies 710. The stack of DRAM dies 710 in FIG. 7 includes 16 DRAM dies, although the invention is not so limited.

Similar to other stair step configurations shown, in FIG. 7, an exposed surface portion 712 is used for a number of wire bond interconnections.

Multiple wire bond interconnections 714, 716 are shown from the dies in the stack of DRAM dies 710 to the substrate 704. Additional conductors (not shown) on or within the substrate 704 further couple the wire bond interconnections 714, 716 to the buffer die 702. The buffer die 702 is shown coupled to the substrate 704 using one or more solder interconnections, such as a solder ball array. A number of substrate solder interconnections 706 are further shown on a bottom side of the substrate 704 to further transmit signals and data from the buffer die into a motherboard and eventually to a host device.

In the example of FIG. 7, the buffer die 702 is located at least partially underneath the stack of DRAM dies 710. In one example, an encapsulant 703 at least partially surrounds the buffer die 702. The example of FIG. 7 further reduces an areal footprint of the memory device 700. Additionally, an interconnect distance between the stack of DRAM dies 710 and the buffer die 702 is reduced.

Figure 8A:
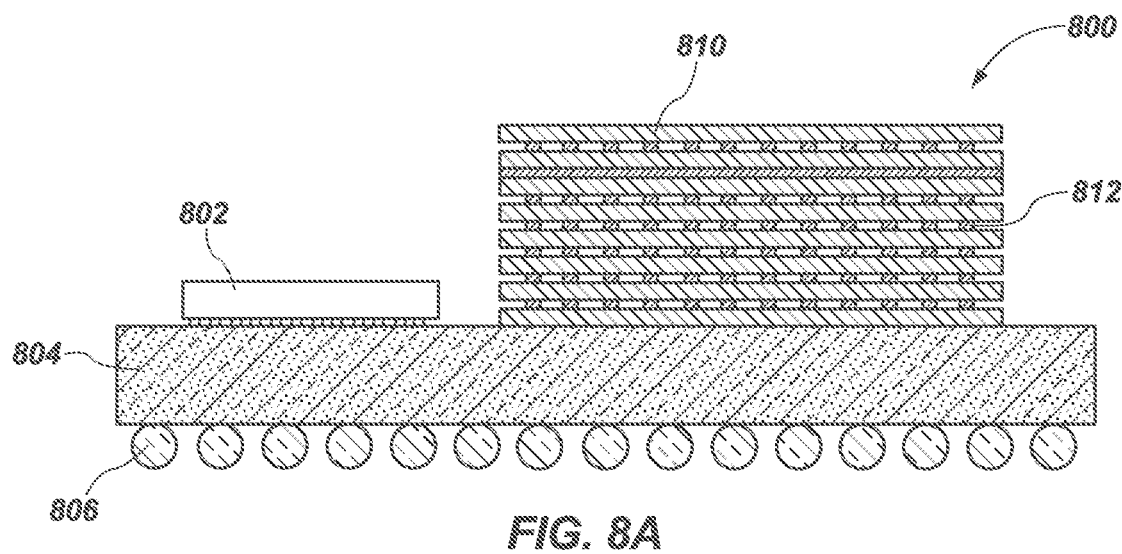
FIG. 8A illustrates another memory device in accordance with some example embodiments.

FIG. 8A shows another example of a memory device 800. The memory device 800 includes a buffer die 802 coupled to a substrate 804. The memory device 800 also includes a stack of DRAM dies 810 coupled to the substrate 804. In the example of FIG. 8A, the stack of DRAM dies 810 are vertically aligned. The stack of DRAM dies 810 in FIG. 8A includes 8 DRAM dies, although the invention is not so limited.

Multiple TSV interconnections 812 are shown passing through, and communicating with, one or more dies in the stack of DRAM dies 810 to the substrate 804. Additional conductors (not shown) on or within the substrate 804 further couple the TSVs 812 to the buffer die 802. The buffer die 802 is shown coupled to the substrate 804 using one or more solder interconnections, such as a solder ball array. A number of substrate solder interconnections 806 are further shown on a bottom side of the substrate 804 to further transmit signals and data from the buffer die into a motherboard and eventually to a host device.

Figure 8B:
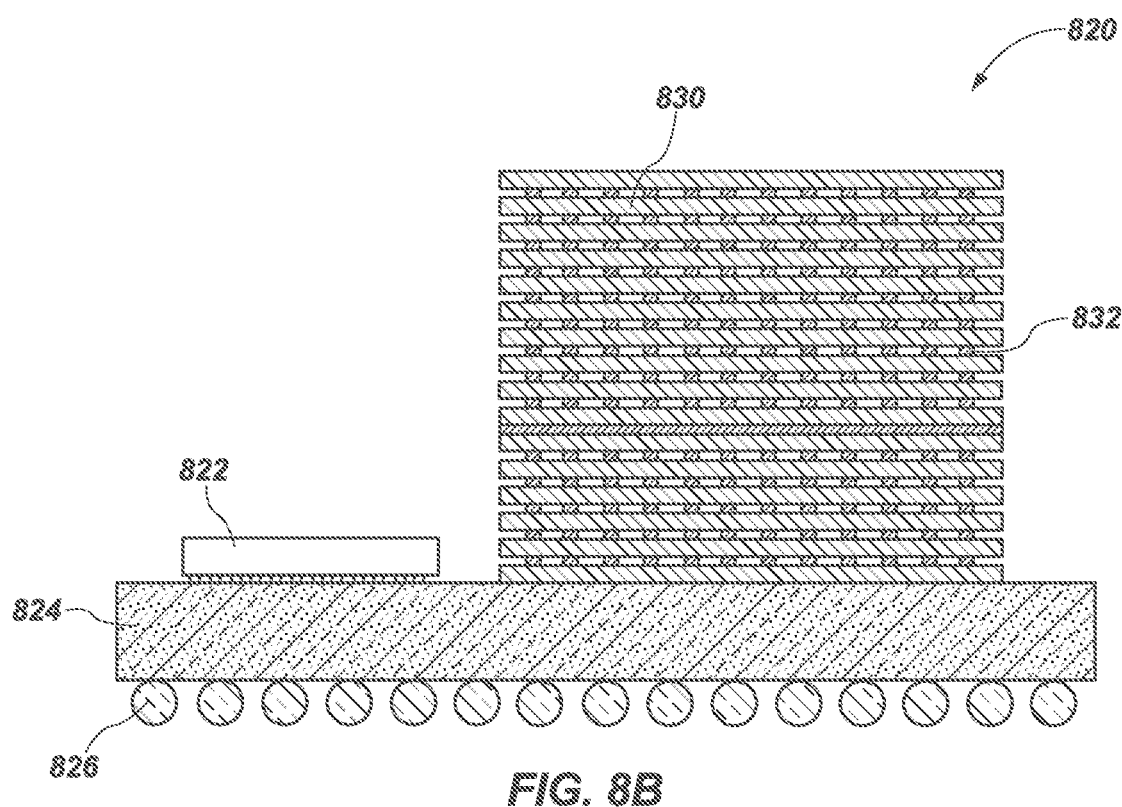
FIG. 8B illustrates another memory device in accordance with some example embodiments.

FIG. 8B shows another example of a memory device 820. The memory device 820 includes a buffer die 822 coupled to a substrate 824. The memory device 820 also includes a stack of DRAM dies 830 coupled to the substrate 824. In the example of FIG. 8B, the stack of DRAM dies 830 are vertically aligned. The stack of DRAM dies 830 in FIG. 8B includes 16 DRAM dies, although the invention is not so limited.

Multiple TSV interconnections 832 are shown passing through, and communicating with, one or more dies in the stack of DRAM dies 830 to the substrate 824. Additional conductors (not shown) on or within the substrate 824 further couple the TSVs 832 to the buffer die 822. The buffer die 822 is shown coupled to the substrate 824 using one or more solder interconnections, such as a solder ball array. A number of substrate solder interconnections 826 are further shown on a bottom side of the substrate 824 to further transmit signals and data from the buffer die into a motherboard and eventually to a host device.

Figure 9A:
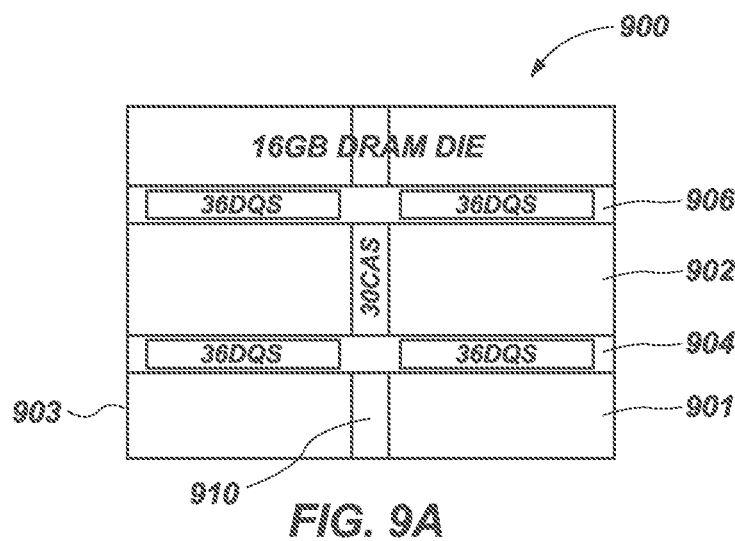
FIG. 9A illustrates a DRAM die configuration in accordance with some example embodiments.

FIG. 9A shows a block diagram of a single DRAM die 900 that may be included in a stack of DRAM dies according to any of the examples in the present disclosure. In FIG. 9A, the DRAM die 900 includes a storage region 902 that contains arrays of memory cells. A first data I/O stripe 904 is shown passing from a first side 901 to a second side 903 of the DRAM die 900. In one example, contacts may be formed on edges of the first data I/O stripe 904 on one or both sides 901, 903 of the first data I/O stripe 904. Contacts may be connected to wire bonds as described in examples above. In other examples, TSVs may be coupled to the first data I/O stripe 904, at sides 901, 903, or other locations along the first data I/O stripe 904.

A second data I/O stripe 906 is further shown in FIG. 9A. In one example, the second data I/O stripe 906 is substantially the same as the first data I/O stripe 904. In the example, of FIG. 9A, each data I/O stripe includes 36 contacts for connection to wire bonds on either side. With two data I/O stripes, and two sides each, the DRAM die 900 includes connections for 144 wire bonds or TSVs.

A command/address stripe 910 is further shown in FIG. 9A. In the example shown, the command/address stripe 910 includes 30 contacts for connection to wire bonds or TSVs. In one example, one or more of the DRAM dies may include a redistribution layer redistributing connections of one or more of the data I/O stripes 904, 906, 910 to a second location for wire bonding, such as to one or more rows of wire bond pads along an edge of the die (as depicted relative to the example wire bonded stack configurations discussed earlier herein). The example numbers of DQ contacts in the data stripes 904 and 906 of FIG. 9A (and also in the data stripes of the examples of FIGS. 9B-9C), and the example numbers of command/address contacts in such examples are relative examples only, and different numbers of contacts for either or both signal types, may be used for any of the described examples.

Figure 9B:
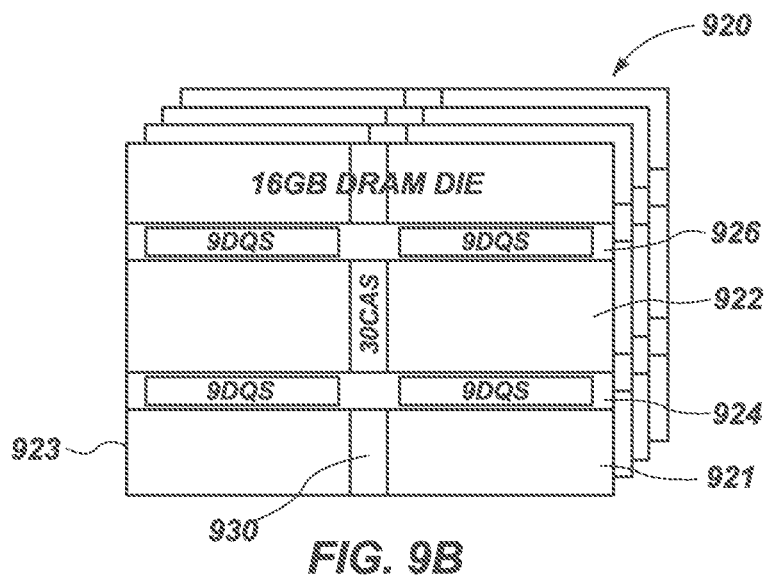
FIG. 9B illustrates another DRAM die configuration in accordance with some example embodiments.

FIG. 9B shows a block diagram of a stack of four DRAM dies 920 that may be included in a stack of DRAM dies according to any of the examples in the present disclosure. In FIG. 9B, each die in the stack 920 includes a storage region 922 that contains arrays of memory cells. A first data I/O stripe 924 is shown passing from a first side 921 to s second side 923 of the stack 920. In one example, contacts may be formed on edges of the first data I/O stripe 924 on one or both sides 921, 923 of the first data I/O stripe 924. Contacts may be connected to wire bonds as described in examples above. In other examples, TSVs may be coupled to the first data I/O stripe 924, at sides 921, 923, or other locations along the first data I/O stripe 924.

A second data I/O stripe 926 is further shown in FIG. 9B. In one example, the second data I/O stripe 926 is substantially the same as the first data I/O stripe 924. In the example, of FIG. 9B, each data I/O stripe includes 9 contacts for connection to wire bonds on either side. With two data I/O stripes, and two sides, each DRAM die in the stack 920 includes connections for 36 wire bonds or TSVs. In one example, all four of the dies in the stack 920 are driven by a single data path as described in examples above.

A command/address stripe 930 is further shown in FIG. 9B. In the example shown, the command/address stripe 930 includes 30 contacts for connection to wire bonds or TSVs.

Figure 9C:
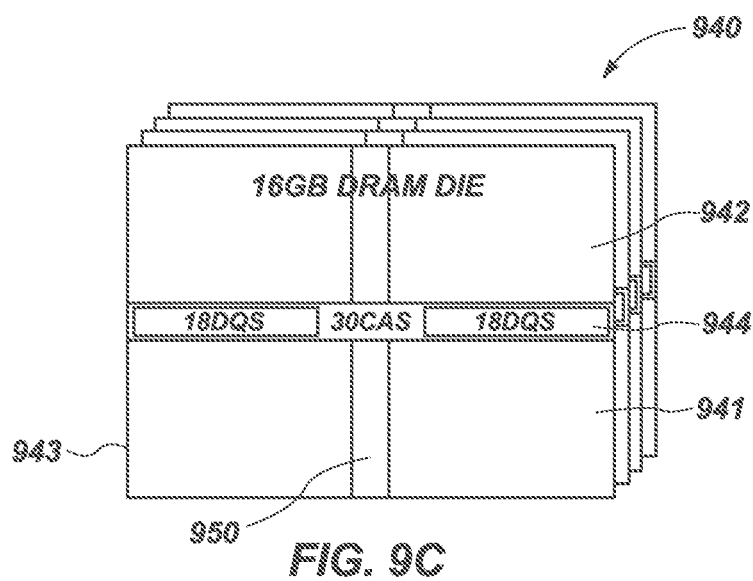
FIG. 9C illustrates another DRAM die configuration in accordance with some example embodiments.

FIG. 9C shows a block diagram of a stack of four DRAM dies 940 that may be included in a stack of DRAM dies according to any of the examples in the present disclosure. In FIG. 9C, each die in the stack 940 includes a storage region 942 that contains arrays of memory cells. A single data I/O stripe 944 is shown passing from a first side 941 to s second side 943 of the stack 940. In one example, contacts may be formed on edges of the data I/O stripe 944 on one or both sides 941, 943 of the data I/O stripe 944. Contacts may be connected to wire bonds as described in examples above. In other examples, TSVs may be coupled to the data I/O stripe 944, at sides 941, 943, or other locations along the first data I/O stripe 944.

In the example, of FIG. 9C, the single data I/O stripe 944 includes 18 contacts for connection to wire bonds on either side. With two sides, each DRAM die in the stack 940 includes connections for 36 wire bonds or TSVs. In one example, all four of the dies in the stack 940 are driven by a single data path as described in examples above.

A command/address stripe 950 is further shown in FIG. 9B. In the example shown, the command/address stripe 950 includes 30 contacts for connection to wire bonds or TSVs.

Figure 10A:
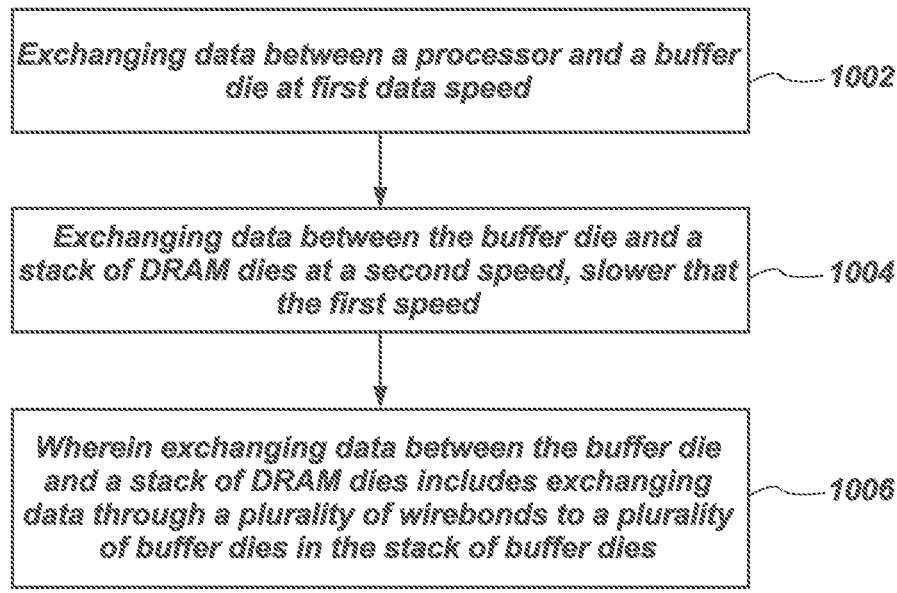
FIG. 10A illustrates an example method flow diagram in accordance with some example embodiments.
Figure 10B:
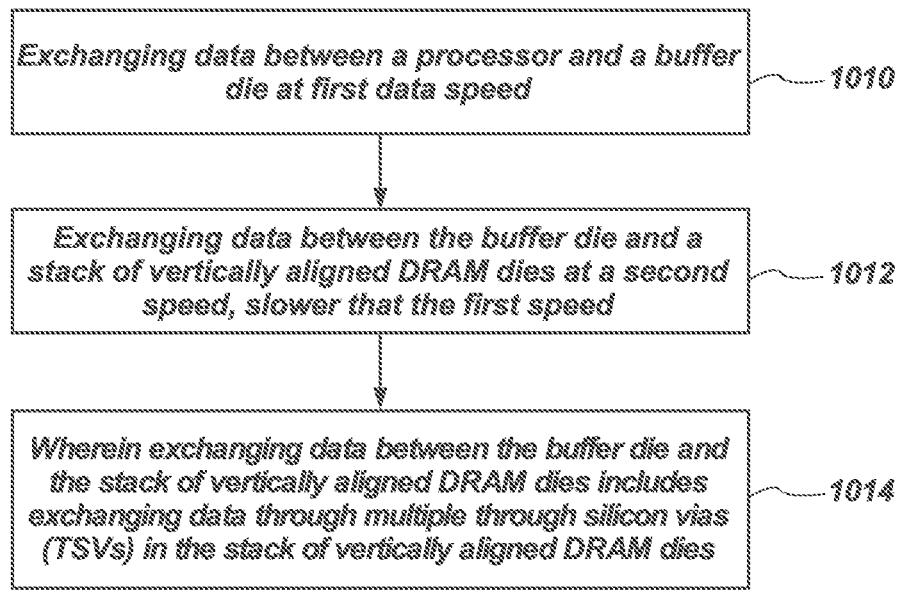
FIG. 10B illustrates another example method flow diagram in accordance with some example embodiments.

FIG. 10A shows a block diagram of one method of operation according to an embodiment of the invention. In operation 1002, data is exchanged between a processor and a buffer die at a first data speed. In operation 1004, data is exchanged between the buffer die and a stack of DRAM dies at a second speed, slower than the first speed. Operation 1006 explains that exchanging data between the buffer die and a stack of DRAM dies includes exchanging data through multiple wirebonds. FIG. 10B shows a block diagram of another method of operation according to an embodiment of the invention. In operation 1010, data is exchanged between a processor and a buffer die at a first data speed. In operation 1012, data is exchanged between the buffer die and a stack of vertically aligned DRAM dies at a second speed, slower than the first speed. Operation 1014 explains that exchanging data between the buffer die and the stack of vertically aligned DRAM dies includes exchanging data through multiple through silicon vias (TSVs) in the stack of vertically aligned DRAM dies.

Figure 11A:
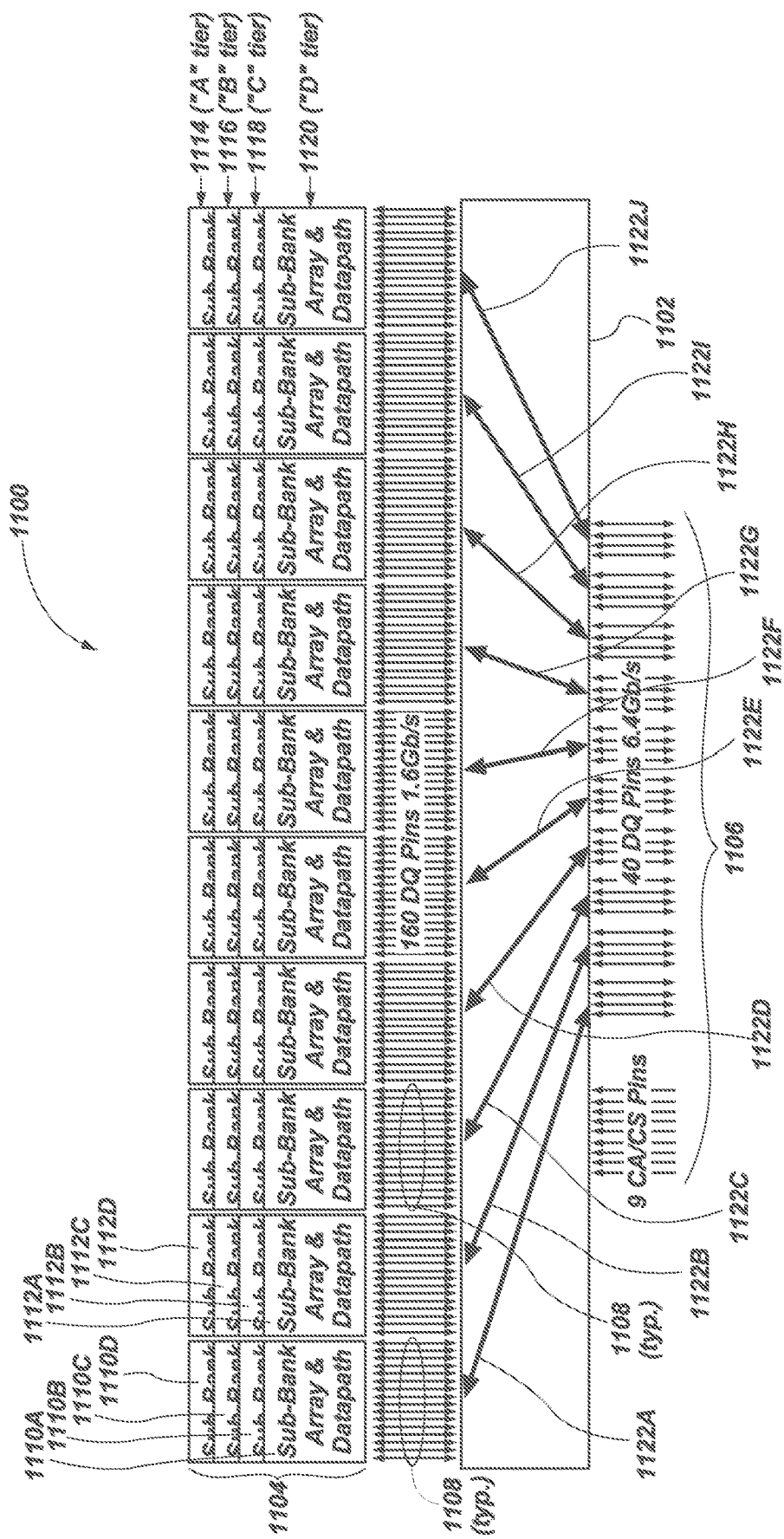
FIG. 11A Illustrates an example embodiment of an alternative configuration and functionality for a memory system.

FIG. 11A depicts an example memory system 1100 including a buffer, as may be implemented, for example, in a buffer die. For convenience in description of the example embodiments, the buffer will be described in the example configuration of the buffer die 1102. However, the described buffer functionality may be implemented in another structure, for example as a portion of another device, such as a memory device or an interposer.

Memory system 1100 can include a range of configurations of a memory structure 1104. In some examples, memory structure 1104 may be a single memory device; but in many examples will include multiple memory devices. Where multiple memory devices are used, the memory devices may be stacked with one another, and/or may be each placed directly, on a supporting substrate, in some cases a printed circuit board (PCB) (such as for example, a system motherboard, or a memory module, such as a dual in-line memory module (DIMM)). In some examples, buffer die 1102 and the individual memory devices of the memory structure 1104 can be configured such that one or more of the memory devices can be mounted directly to buffer die 1102 (or other buffer structure); and in some examples, a stack of memory die may be mounted on (or over) a buffer die. As one example configuration, a system in accordance with the present description can be implemented as a dual rank DDR5 RDIMM, having, for example, 32-40 individual DRAM die, forming two channels.

Buffer die 1102 is cooperatively configured with a memory structure 1104 to avoid loss of data in the event of failure of a portion of a memory array, or of the control and/or data paths associated with a respective portion of the array. To implement this functionality, a first interface 1106, termed herein a "host interface" for the descriptions herein, as described above, will include additional DQ connections for ECC/parity bits. For example, the host interface for the buffer die of FIG. 3 was depicted as having 36 DQs, 32 DQs carrying data and 4 DQs carrying ECC/parity bits. In the example of FIG. 11, this host interface is expanded, for example by 4 additional DQs carrying ECC/parity bits.

FIG. 11A also depicts an alternative embodiment of the CA interface as (which, as discussed earlier herein, may include one or more chip select "CS" paths). In some example systems, the CA paths may be single clocked (in contrast to the DQs, which are typically double clocked), and the CA paths may therefore be increased in number, in comparison with the example of FIG. 3. For example, in some systems, a system host may interface with an intermediate device for driving and buffering the interface connections (such as, for example, a Registered Clock Driver (RCD) used with some DDR 5 devices). In selected embodiments, the buffer die 1102 as described herein may be placed between such intermediate buffering device and the memory structure; but in other examples the buffer die 1102 may be implemented to stand in place of such intermediate driving and buffering devices (such as RCDs, for example).

The number of CA paths required for the memory physical interfaces may vary depending upon the addressing methodology for the memory (and, for example, the use, if any, of chip select pins in operating the memory structure). Accordingly, the example numbers of CA paths (including any CS pins), are illustrative only, and the numbers of CA paths on either the host physical interface or the memory physical interfaces may be different than the example numbers identified herein. In some example configurations, just as DQ connections are mapped from four DQs to 16 DQs (in the depicted example), CA paths may be mapped to an increased number of CA paths. Due to the presence of paths for CS, clock, etc. not all control/address paths need to be multiplied. In one example, CA paths at the host interface may be mapped to (by way of example only) from 30 CA paths to 120 CA paths, arranged in 4 DRAM CA PHY interfaces, each having 30 CA paths. Again in an example configuration, each DRAM CA PHY may be configured to drive four DRAM loads; such that the described configuration would therefore be able to service 16 DRAM die.

In the example of FIG. 11A, buffer die 1102 is configured to reallocate the example 40 DQ data paths of the host PHY 1106 to multiple DRAM DQ PHYs, each DRAM DQ PHY configured to communicate with at least one respective region of memory structure 1104, with each DRAM DQ PHY being wider, and operating at a slower data transfer speed, than the corresponding portion of the host interface, in a manner analogous to that described relative to FIG. 3. The description of multiple DRAM PHYs it is not intended to represent a specific physical structure, but rather a reallocation of a group of pins from the host interface to a greater number of pins at the memory interface. In order to maintain the ability to recover from errors impacting multiple pins at the host PHY 1106, in some examples it will be desirable to maintain generally separate sub-channels through the buffer die 1102 and to the memory interface, and then to a generally independently operable logical region (or "slice") of the memory structure, as discussed in more detail below relative FIG. 12. Accordingly, the pin connections for communicating data signals (DQs) with the memory structure for each such sub-channel is discussed herein as a DRAM PHY.

In some cases, the host PHY 1106 can represent a channel or sub-channel of a memory bus. For example, in some embodiments, the host PHY 1106 can be configured in accordance with the DDR 5 specification promulgated by JEDEC; and, by way of example only, the example of Host PHY 1106 can represent one independent memory channel in accordance with that standard.

In the depicted example, buffer die 1102 will reallocate the 40 DQ pins of the host interface to multiple memory physical interfaces, as discussed relative to FIG. 3. FIG. 11A does not depict the various functionalities present in the buffer die. However, buffer die 1102 should be understood to include controller and switching logic structure; reliability, availability, and serviceability (RAS) structures; and built-in self-test (BIST) structures; all as discussed relative to buffer die 300 of FIG. 3 (though as will be apparent to persons skilled in the art having the benefit of this disclosure the structures may be adapted to accomplish the different data path reallocation of the present depicted embodiment). In the depicted example, the host PHY 1106 may operate, for example, at a data transfer rate of approximately 6.4 Gb/s at the DQs; while the DRAM DQ PHYs may include (collectively) 160 pins operating at a data transfer rate of approximately 1.6 Gb/s. Analogous transfer rates will apply to the CA pins.

Additionally, the pins of the memory physical interfaces will be allocated to at least 10, or a multiple of 10, sub-arrays of memory structure 1104. In one example, every 4 sequential DQs of host physical interface 1106 will be mapped to a respective DRAM DQ PHY, indicated functionally by 16 DQs, identified by example at 1108 (as indicated by arrows 1122 A-J), which extend to multiple sub-arrays. In other examples, DQs may be re-mapped other than in groups of four sequential DQs. In some examples, alternate DQs may be re-mapped in place of four sequential DQs (i.e., for example a selected number of "even" DQs may be re-mapped separately from a selected number of "odd" DQs). In other examples, as discussed later herein, pins of the memory physical interfaces may be allocated to a different number of sub-arrays (and/or a different number of slices of the memory structure). For example, as will be discussed relative to FIG. 15, the DQs of the memory physical interfaces may be allocated to nine sub-arrays (slices) of the memory structure.

As discussed previously, in many examples, each respective DRAM DQ PHY (and datapath 1108) will operate at a data transfer rate slower than that of the host physical interface 1106. For example, each DQ data path 1108 of a respective memory physical interface may operate at one-quarter of the data transfer rate of host physical interface 1106 (in the example discussed above, 1.6 Gb/s). In other examples, every 4 sequential DQ data paths of host physical interface 1106 may be mapped to DRAM DQ PHYs having 8 DQs (rather than 16, as depicted), and operating (for example) at one-half the data transfer rate of the host PHY rather than one-quarter, as in the depicted example of FIG. 11A. Examples of various potential implementations of host interface pin reallocation include the following (the example pin rates are illustrative only, and are provided as examples for purposes of illustration; as actual pin rates in various implementations may be substantially slower or faster than the provided examples):

| Topology | Host I/F DQ pins | Host I/F CAs | Pin Rate | Memory DQ pins | Memory CA Pins | Loads DQ/Pin |
|---|---|---|---|---|---|---|
| Single | 80 | 30 | 3.2 Gb/s | 1152 | 120 | 1 |
|  | 80 | 30 | 1.6 Gb/s/pin PAM4 | 288 | 120 | 4 |
|  | 160 | 30 | 1.6 Gb/s | 576 | 120 | 4 |
|  | 320 | 30 | 0.8 Gb/s | 288 | 120 | 16 |
| Twin | 40 | 30 | 3.2 Gb/s | 576 | 120 | 1 |
|  | 40 | 30 | 1.6 Gb/s/pin PAM4 | 144 | 120 | 4 |
|  | 80 | 30 | 1.6 Gb/s | 288 | 120 | 4 |

-continued

| Topology | Host I/F DQ pins | Host I/F CAs | Pin Rate | Memory DQ pins | Memory CA Pins | Loads DQ/Pin |
|---|---|---|---|---|---|---|
|  | 160 | 30 | 0.8 Gb/s | 144 | 120 | 16 |
| Quad | 20 | 30 | 3.2 Gb/s | 288 | 120 | 1 |
|  | 40 | 30 | 1.6 Gb/s | 144 | 120 | 4 |
|  | 80 | 30 | 0.8 Gb/s | 72 | 120 | 16 |

Figure 11B:
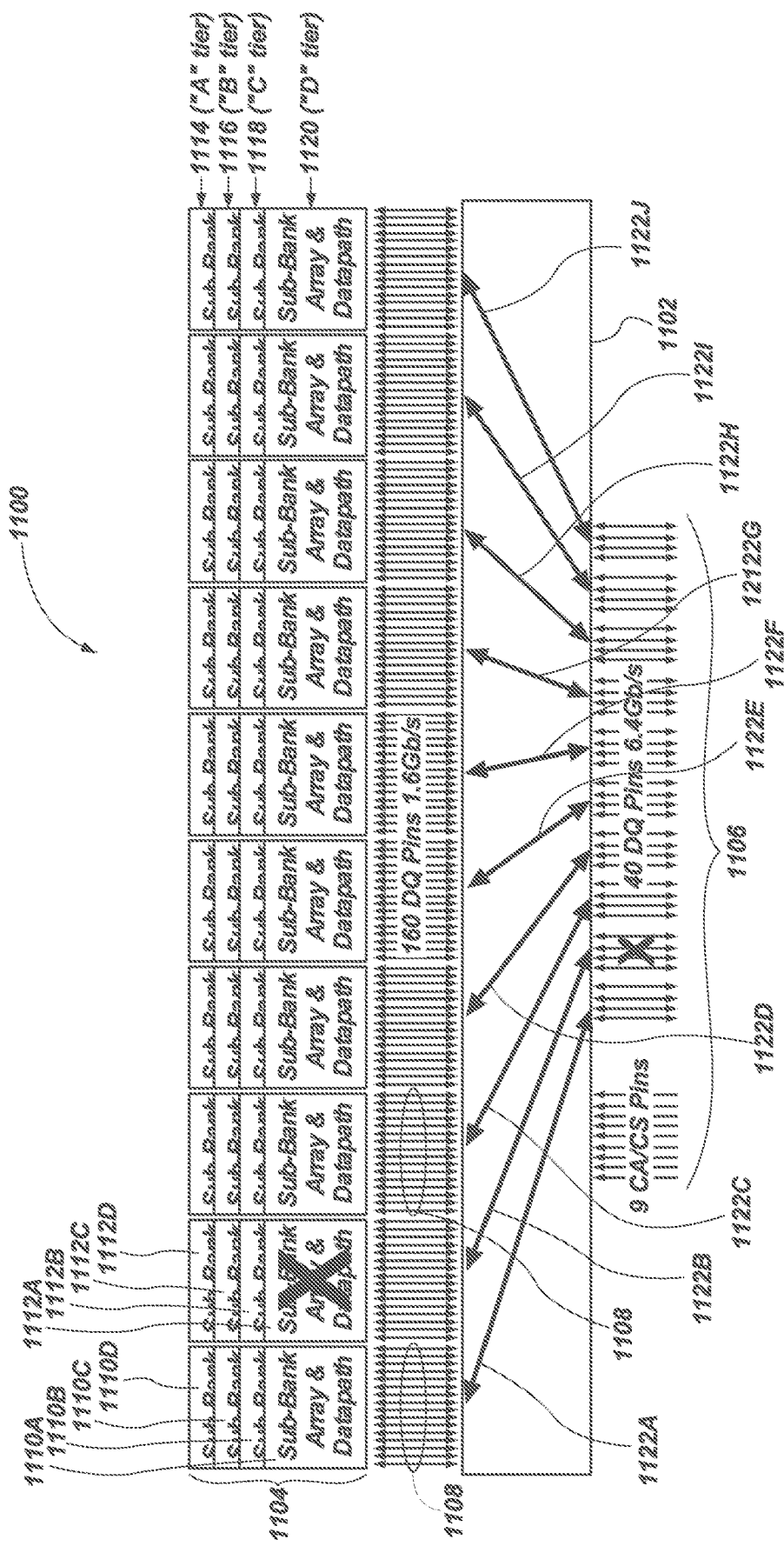
FIG. 11B illustrates the memory system of FIG. 11A, under an example failure condition.

Each DRAM DQ PHY will be coupled through the respective datapath 1108 to multiple sub-arrays (as indicated by example at 1110A-D, 1112A-D). In general, a DRAM bank may include multiple thousands of rows of memory cells, and will include includes multiple sub-arrays. Each sub-array will include some subset of the rows of the bank; and will include row buffers for the subset of rows, and sense amplifiers. Allocation of the host physical interface 40 DQ pins across a group of at least 10 sub-channels, and allocation of each consecutive group of 4 host physical interface DQs to separate sub-channels (as indicated by arrows 1122A-J), allows recovery of data even in the event of a failed sub-channel or sub-array (as depicted in FIG. 11B, at sub-array 1110A-1) (or a failed "slice" of the memory device, as discussed below), through use of the eight ECC/parity bits at the host interface, in a manner apparent to persons skilled in the art having the benefit of this disclosure. These data recovery mechanisms are commonly found in systems that utilize ChipKill or SDDC, as discussed earlier herein. Such recovery from a failed slice (or other region of memory) can be performed under control of the host. In some examples, individual memory die, and/or buffer 1102, may also include internal ECC functionality to recover from local single or dual bit errors, as known to persons skilled in the art.

Each DRAM DQ PHY 1108 may be coupled to sub-arrays in multiple ranks of the memory devices and/or multiple banks of the memory devices (and/or spanning the multiple memory devices and/or banks of the memory devices). As a result, in reference to FIG. 11A, each of the depicted overlapping tiers of identified sub-bank arrays (i.e., sub-arrays), as indicated generally at 1114, 1116, 1118, 1120, may be located in different memory devices, or in different ranks and/or banks of memory devices, within a memory structure 1104.

Figure 12:
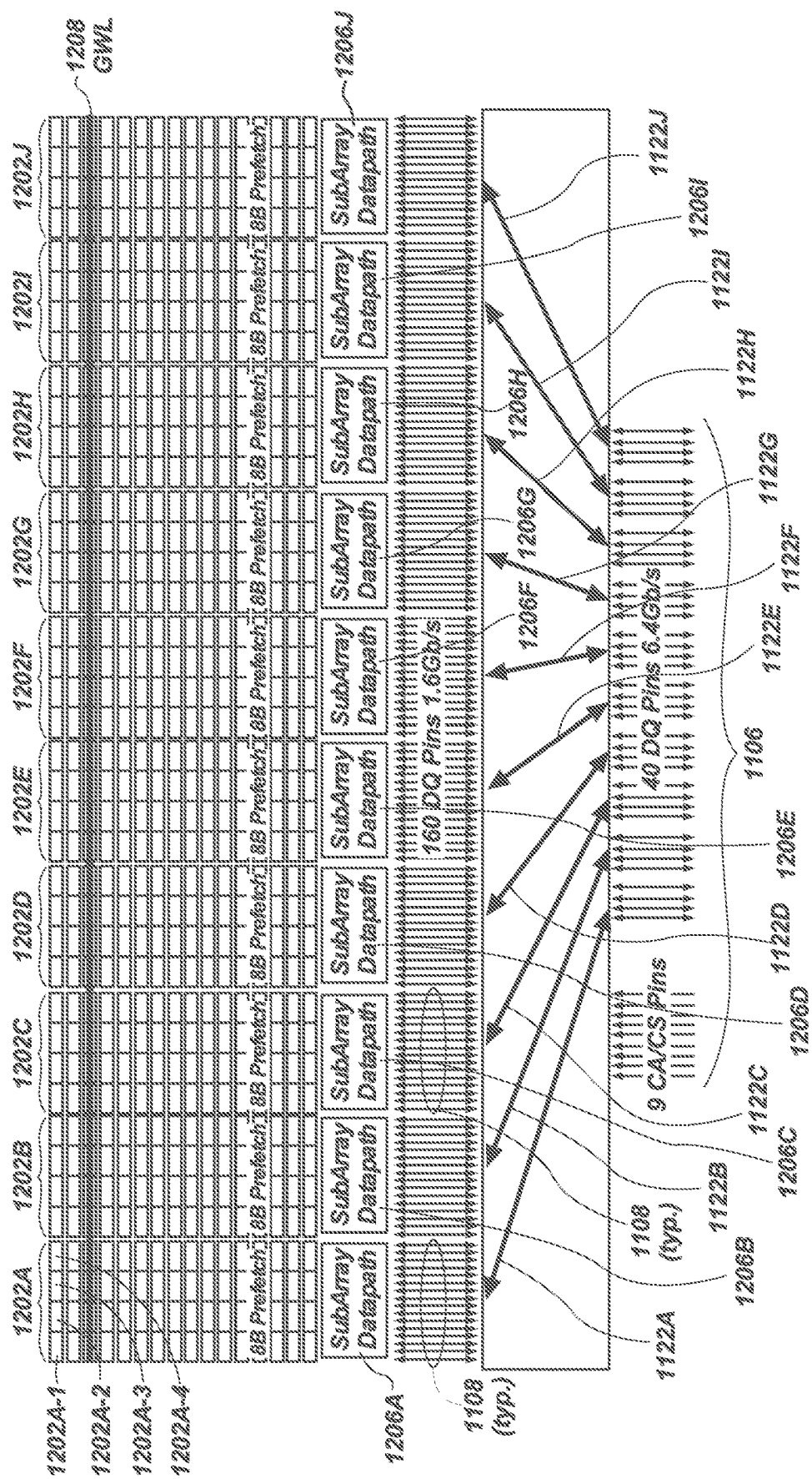
FIG. 12 illustrates an example configuration for a portion of the memory system of FIG. 11A.

FIG. 12 depicts an example memory system 1200, depicted in a block diagram representation, showing an example structure for a group of sub-arrays analogous to those depicted in each of tiers 1114 ("A" tier), 1116 ("B" tier), 1118 ("C" tier), 1120 ("D" tier), in FIGS. 11A-11B. The depicted example structure of memory system 1200 is a logical representation rather than a physical representation.

For purposes of the present description, the term "slice" will be used to refer to the portions of the ten (or other number) logical regions of the memory array (in the present example, sub-arrays) coupled to a respective DRAM DQ PHY having a respective data path 1108, in combination with the CA paths and the read/write data paths (DQs) to the I/O circuits for that portion of the array. FIG. 12 depicts 10 memory slices 1202A-J, each formed of a respective group of memory cells, in this example, a sub-array, as indicated at 1204A-J, with an associated data path 1206A-J. As discussed relative to the embodiment of FIG. 3, though not specifically depicted in FIG. 12, at least a pertinent portion of the DRAM CA PHY interface will be distributed to each sub-array to provide addressing for each of the sub-arrays. In various embodiments, the depicted memory slices 1202A-J may be formed on one memory die, or may be distributed across multiple memory die. In selected examples, an individual host PHY DQ will be distributed (through a respective sub-array data path 1108) to each memory unit (die, rank, or bank) within a respective slice.

Each sub-array includes multiple array mats, as indicated by example in slice 1202A at 1202A-1 to 1202A-4. The number of memory cells in each array mat, and the related number of word lines and data lines is a matter of design choice. Thus, the configuration of each array mat can be based on design considerations, such as, for example, the process node (as to feature size), the related size and configuration of each memory cell, as well as desired dimensions for local word lines within the array mat, etc. In many examples, an array mat will extend between rows of sense amps on opposing sides of the array mat (in the column direction) and will have sub-word line decoders on at least one, if not both, remaining sides of the array mat (in the row direction). In some examples, physically adjacent array mats (in some cases separated by sub-word line decoders) may form a bank.

One example configuration includes the depicted 10 memory slices 1202A-J formed on a single memory die; and in accordance with that configuration, a representative global word line 1208 (of multiple global word lines) is depicted extending across the depicted slices and to multiple array mats within each slice. As will be apparent to persons skilled in the art having the benefit of this disclosure, the global word lines 1208 will carry a higher order term across the associated sub-arrays and mats. In many examples, sub-word line decoders will use additional terms to drive local word lines within each array mat, or pair of array mats (or other grouping of memory cells) along the global word lines.

In the depicted example, each sub-array includes a large number of separately addressable mats. As depicted, each sub-array includes a matrix array mats, including four mats along the row direction (i.e. in the direction of global word line 1208), and 16 array mats along the column direction (perpendicular to the direction of global word line 1208). The memory structure can be configured that each memory page includes a multiple of 10 array mats. The array mats of a page are not necessarily physically aligned with one another, as in the logical representation of FIG. 12. The example of memory system 1200 includes 40 array mats, which can be configured to provide a 4 kB page. In this example configuration, each of the 10 depicted sub-arrays 1204A-J includes 4 array mats, configured such that each sub-array can be configured to provide a respective 8 Bytes of an 80 Byte prefetch (64 Bytes of data, 8 bytes of parity bits, and 8 Bytes of ECC bits). In an example such as that described relative to FIG. 11B, in which each slice is distributed across four tiers, each tier will provide one quarter of the prefetch. For example, where each tier in a slice comprises a portion of a respective memory device, each memory device will provide 2B of the 8B per slice prefetch. Other examples may have a different configuration, and be adapted to prefetch a different number of Bytes (example 60 Bytes or 100 Bytes). In many desirable examples, the Bytes of the prefetch will be a multiple of 10.

The ability to configure memory system 1200 to provide a page size of approximately 4 kB, for example in a DIMM, is believed to facilitate having a significantly smaller power envelope than that required, for example, with a conventional DRAM DIMM configuration. In accordance with the present description, the 4 kB page may be allocated across one, two, or four (or more) memory die. In a conventional DRAM DIMM configuration, a page size of 20-40 kB would be common, requiring substantially more power than required for accessing a smaller page in accordance with the described configuration. The current belief is that a 40 DRAM die DIMM, configured with approximately 4 kB pages may require 40 to 60% less power than conventional configurations using a 20-40 kB page.

One consideration in implementing the techniques described and implemented herein is to configure the slices (or other groupings of memory cells and the associated circuitry) to minimize shared points of failure. For example, in conventional DRAM memory devices, sub-word line drivers may extend between a pair of array mats and drive local word lines within each adjacent mat. However, in example system 1200 as described above, including 4 parity bits and 4 ECC/parity bits associated with 32 data bits (at the host physical interface), can only recover from failure associated with 4 of such data bits. In an example memory system, if physically adjacent mats were driven with a shared sub-word line driver, then a failure of the shared sub-word line driver could affect multiple array mats, and therefore result in an irrecoverable error. As a result, in such a structure, it would be advantageous to have separate sub-word line drivers for each array mat, so as to minimize shared points of failure. Similarly, common control circuits within a sub-array (or an analogous grouping of memory cells), such as those controlling addressing and timing may be provided independently for each array mat. By way of example, sub-word line drivers that cross the sub-array boundaries do not present the same issue, since the column decoder circuits for the separate sub-arrays (i.e., in respective slices) will prevent selection of data from adjacent array mats across those boundaries.

In other examples, slices of a page may be allocated across different devices or banks within a device. However, requiring more devices/banks to be activated to read or write a page of data, will typically require activation of multiple global word lines, and therefore may require power beyond desired levels.

Figure 13:
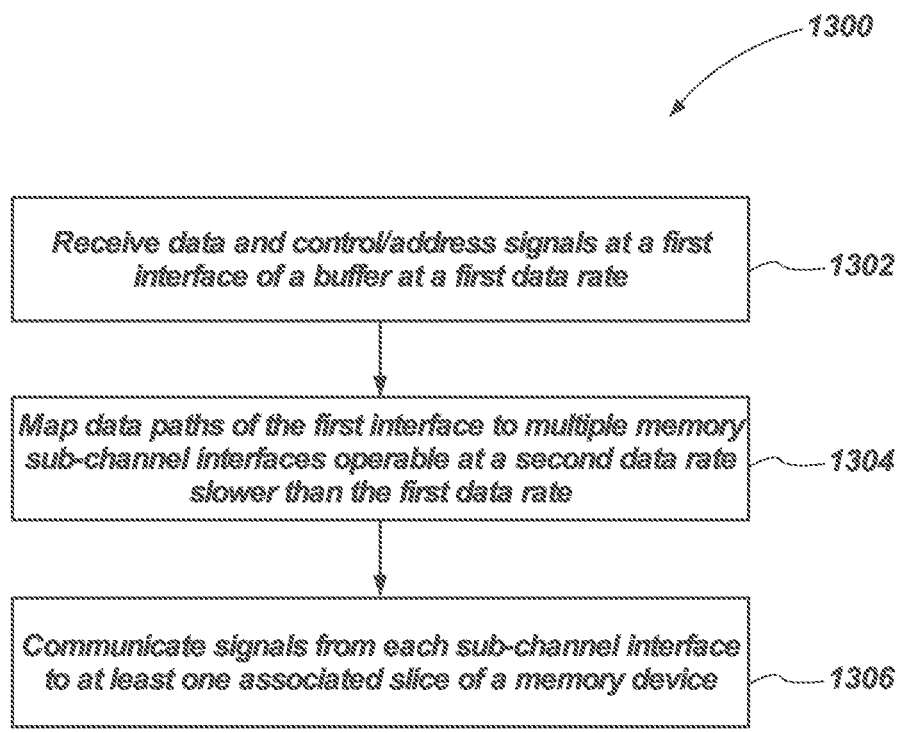
FIG. 13 illustrates an example method flow diagram in accordance with some example embodiments.

FIG. 13 illustrates a flowchart of an example method of operation of the memory system. In method 1300, data and control/address signals are received at a first interface of a buffer structure at a first data rate, as indicated at 1302. In some examples, the data pins will include multiple data pins coupled to carry data bits, multiple data pins coupled to carry ECC/parity bits, and multiple data pins coupled to carry parity bits for use in ECC operations. The data pins of the first interface are mapped to multiple memory sub-channel interfaces, which are operable at a second data rate, which is slower than the first data rate of the first interface, as indicated at 1304. Examples of such reallocation of data pins in the buffer structure are discussed in reference to FIGS. 11A-11B. In some desirable examples, the first interface will be mapped to at least 10 sub-channel interfaces. Additionally, in some examples, each data pin of the first interface will be mapped to at least two data pins of a memory sub-channel interface. In various examples, the reallocation may be performed at least in part by firmware including instructions stored a machine-readable storage device, such as one or more non-volatile memory devices.

As a result of the reallocation, as indicated at 1306, signals may then be communicated from each sub-channel interface to a respective slice of a memory device (also as discussed in reference to FIGS. 11A-11B). In some examples, each slice of the memory device may include multiple array mats.

Figure 14:
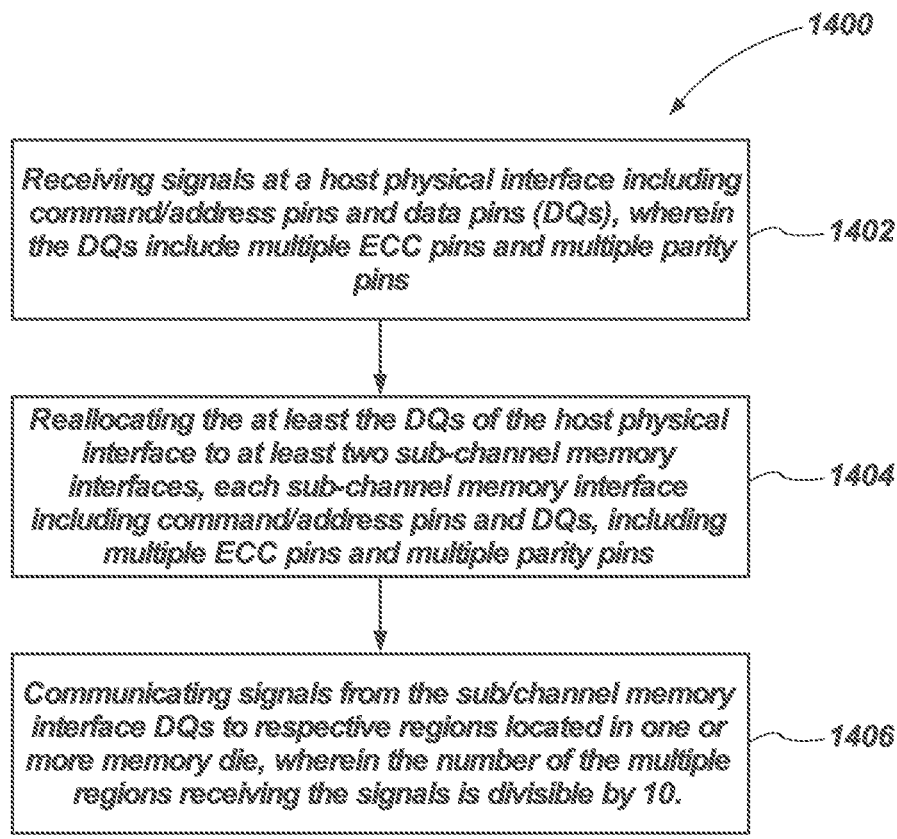
FIG. 14 illustrates an example method flow diagram in accordance with other example embodiments.

FIG. 14 illustrates a flowchart of an alternative example method of operation 1400 of a memory system. In method 1400, As indicated at 1402, signals are received at host physical interface including command/address (CA) pins and data pins (DQs), in which the DQs include multiple ECC/parity pins.

As indicated at 1404 at least the DQs of the host physical interface are mapped to at least two sub-channel memory interfaces, with each sub-channel memory interface including CA pins and DQs, The DQs including multiple ECC pins and multiple parity pins. As discussed relative to method 1300, at least some portion of the reallocation may be performed by firmware including instructions stored in a machine-readable storage device forming a portion of the controller and switching logic 316, as discussed in reference to FIG. 3.

Subsequently, as indicated at 1406, signals may be communicated from the sub-channel memory interfaces to respective regions located in one or more memory die, in which the receiving the signals is divisible by 10. In some examples, each region may be a sub-array of a memory die (though the number of regions may be distributed across multiple memory die. And in some examples each region will include multiple array mats.

Figure 15:
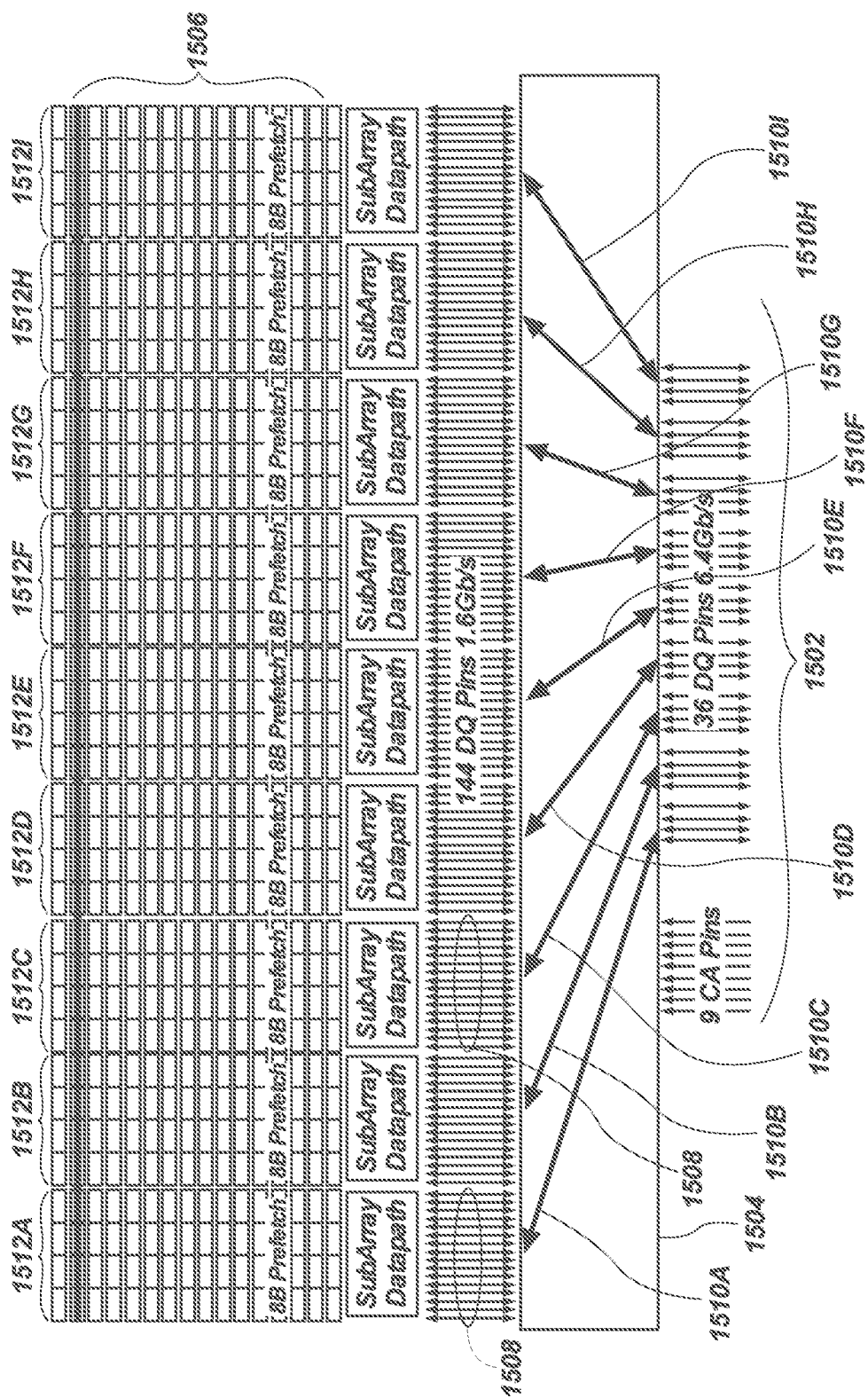
FIG. 15 depicts an example embodiment of an alternative configuration and functionality of a memory system.

FIG. 15 discloses an alternative configuration and functionality for a memory system 1500. Memory system 1500 includes, as an example, an implementation of a host interface PHY 1502 and buffer device 1504 analogous to that described relative to interface 322 and buffer die 300 of FIG. 3, but differing, for example, in the memory interface configuration, as described herein. Memory system 1500 further incorporates a memory structure 1506 having some features generally discussed in reference to memory structure 1104 of FIG. 11. As a result, except for differences discussed here in reference to FIG. 15, the discussion of the structure and operation of memory system 1100, in reference to FIGS. 11-13 is applicable to a memory system 1500, and will not be repeated here As can be seen in FIG. 15, host PHY 1502 includes (as an example) 36 DQ pins, providing a data interface of approximately 6.4 Gb/s. The 36 DQ pins may include, for example 32 DQ pins allocated to data, and four DQ pins to ECC/parity bits for the associated data. Thus, example host PHY 1502 differs from host PHY 1104 of FIG. 11 in including only four DQs for ECC/parity bits (for which eight DQs were allocated in host PHY 1104). As described below, these 36 DQ's will be remapped to nine slices (or more, such as a multiple of nine) within the memory structure.

In other examples, the Host PHY may include only CA pins and data DQ pins (i.e., no ECC/parity DQs). For example, 32 data DQs, as may be used, for example in systems consistent with the previously identified DDR 5 standard of JEDEC). In some cases, those 32 Host PHY DQs may then each be remapped to multiple DQs at the DRAM DQ PHYs (as discussed in detail above), and applied to eight slices (or more, such as a multiple of eight) within the memory structure.

In the depicted example, each group of four DQ bits is reallocated to 16 DQs at a DRAM DQ PHY interface, indicated generally at 1508, and by arrows 1510A-I; which in turn connect to a respective slice 1512A-I of memory structure 1506. In some examples each consecutive four DQ bits will be reallocated to 16 DQs communicated to a respective slice. Other allocations are possible in other examples; for example, some number of even-numbered bits/pins at the host PHY 1502 may be reallocated to a first slice 1510A-I of memory structure, while adjacent odd-numbered bits/pins may be reallocated to a second slice. In other examples, either a greater or lesser number of bits of the host PHY 1502 may be reallocated to the respective slices 1510A-I. In the depicted example, data DQs will be re-mapped to multiple pins in eight slices (1510A-I), while the ECC/parity bit DQs will be re-mapped to a ninth slice.

As with memory system 1100, memory system 1500 can be implemented with a smaller page size, for example a 4K page size, allocated across one, or multiple memory die. For example, in the depicted embodiment, the 4K page size may be allocated across 36 array mats. Additionally, as discussed relative to memory system 1100, in some examples each sub-array may include four array mats of the page, such that each sub-array provides 8 Bytes of data of a 72 Byte prefetch (64 Bytes of data and 8 Bytes of ECC/parity bits). However as described relative to memory system 1100, a memory system analogous to memory system 1500 may be configured to implement other page sizes and/or prefetch sizes.

In example systems, memory slices (whether containing one or more memory devices), can be of selected granularity. For example, the example configuration of memory system 1500, includes nine slices 1512-1512J, with each slice including four array mats 1514 in the row direction (the direction of global word line 1516); and with 4 DQs of the host interface mapped (1 to 4) to each slice. As an alternative, memory system may be configured to allocate the 4 kB page size across, for example, 18 slices, with each slice having a row direction dimension with two array mats. In such a configuration, each slice could be configured for a 4B prefetch (which in a four sub-bank data array, as discussed relative to FIG. 11B), would include a 1B prefetch per sub-array. In one example configuration, instead of 4 host interface DQs being mapped to each slice as in FIG. 15, 2 host interface DQs may be mapped to each slice. Separate from the number of host DQs mapped to a respective slice; each host DQ may be mapped to a selected number of memory interface DQs, as discussed relative to table 1, depending on the array configurations and desired loading.

As with memory system 1100, memory system 1500 may be implemented in various configurations including with one or more memory devices in various contexts. In some examples, memory system 1500 may be implemented with multiple memory devices supported directly or indirectly on a substrate, or on buffer 1504; while in other examples memory system 1500 may be implemented in an assembly with multiple memory devices arranged (individually, or in stacks) on a memory module, for example a DIMM module.

In some examples, any of the embodiments described herein may be implemented in accordance with a selected standard. For example, as noted previously, the host interface for the buffers may be configured in accordance with the DDR 5 standard under development by the JC-42 Committee for Solid State Memories, or future iterations thereof. In other examples, the interfaces and memory system functionality may be configured for interoperability in accordance with other industry standards.

Memory system 1500 may be operated in accordance with the example method 1300 discussed in reference to the flowchart of FIG. 13. Accordingly, the description of that method is not repeated here.

Figure 16:
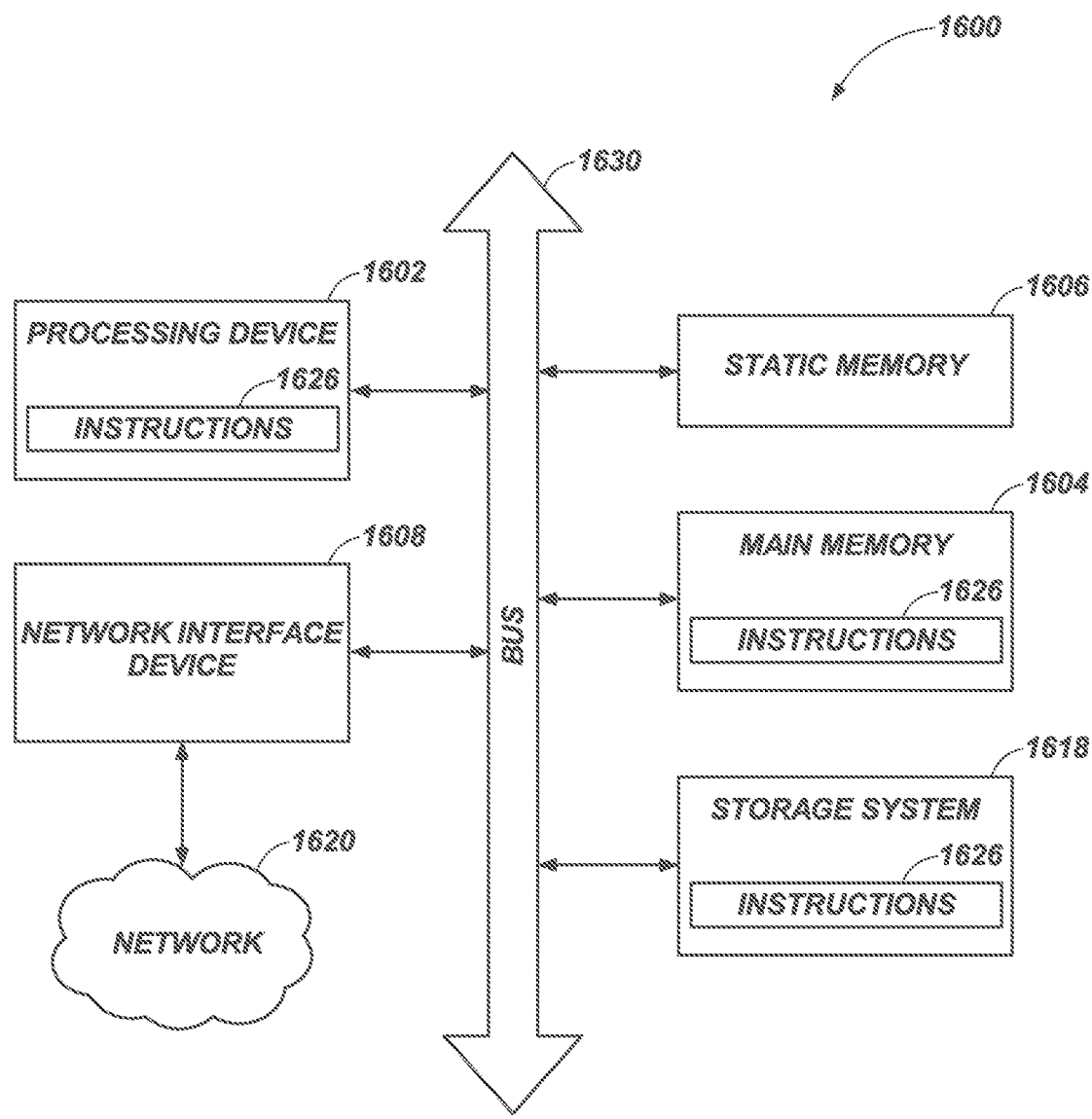
FIG. 16 illustrates an example block diagram of an information handling system in accordance with some example embodiments.

FIG. 16 illustrates a block diagram of an example machine (e.g., a host system) 1600 which may include one or more memory devices and/or memory systems as described above. As discussed above, machine 1600 may benefit from enhanced memory performance from use of one or more of the described memory devices and/or memory systems, facilitating improved performance of machine 1600 (as for many such machines or systems, efficient reading and writing of memory can facilitate improved performance of a processor or other components that machine, as described further below.

In alternative embodiments, the machine 1600 may operate as a standalone device or may be connected (e.g., networked) to other machines. In a networked deployment, the machine 1600 may operate in the capacity of a server machine, a client machine, or both in server-client network environments. In an example, the machine 1600 may act as a peer machine in peer-to-peer (P2P) (or other distributed) network environment. The machine 1600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 1600 may include a processing device 1602 (e.g., a hardware processor, a central processing unit (CPU), a graphics processing unit (GPU), a hardware processor core, or any combination thereof, etc.), a main memory 1604 (e.g., read-only memory (ROM), dynamic random-access memory (DRAM) such as synchronous DRAM (SDRAM) or Rambus DRAM (RDRAM), etc.), a static memory 1606 (e.g., static random-access memory (SRAM), etc.), and a storage system 1618, some or all of which may communicate with each other via a communication interface (e.g., a bus) 1630. In one example, the main memory 1604 includes one or more memory devices as described in examples above.

The processing device 1602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1602 can also be one or more special-purpose processing devices such as an application specific integrated circuit (ASIC), a field programmable gate array (FPGA), a digital signal processor (DSP), network processor, or the like. The processing device 1602 can be configured to execute instructions 1626 for performing the operations and steps discussed herein. The computer system 1600 can further include a network interface device 1608 to communicate over a network 1620.

The storage system 1618 can include a machine-readable storage medium (also known as a computer-readable medium) on which is stored one or more sets of instructions 1626 or software embodying any one or more of the methodologies or functions described herein. The instructions 1626 can also reside, completely or at least partially, within the main memory 1604 or within the processing device 1602 during execution thereof by the computer system 1600, the main memory 1604 and the processing device 1602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 1600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1626 (e.g., software, programs, an operating system (OS), etc.) or other data are stored on the storage system 1618 can be accessed by the main memory 1604 for use by the processing device 1602. The main memory 1604 (e.g., DRAM) is typically fast, but volatile, and thus a different type of storage than the storage system 1618 (e.g., an SSD), which is suitable for long-term storage, including while in an "off" condition. The instructions 1626 or data in use by a user or the machine 1600 are typically loaded in the main memory 1604 for use by the processing device 1602. When the main memory 1604 is full, virtual space from the storage system 1618 can be allocated to supplement the main memory 1604; however, because the storage system 1618 device is typically slower than the main memory 1604, and write speeds are typically at least twice as slow as read speeds, use of virtual memory can greatly reduce user experience due to storage system latency (in contrast to the main memory 1604, e.g., DRAM). Further, use of the storage system 1618 for virtual memory can greatly reduce the usable lifespan of the storage system 1618.

The instructions 1624 may further be transmitted or received over a network 1620 using a transmission medium via the network interface device 1608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.15 family of standards known as Wi-Fi®, IEEE 802.16 family of standards known as WiMax®), IEEE 802.15.4 family of standards, peer-to-peer (P2P) networks, among others. In an example, the network interface device 1608 may include one or more physical jacks (e.g., Ethernet, coaxial, or phone jacks) or one or more antennas to connect to the network 1620. In an example, the network interface device 1608 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" is used herein to refer generally to any structure on which integrated circuits are formed, and also to such structures during various stages of integrated circuit fabrication. The term "substrate" is used to refer to either a wafer, or other structures which support or connect to other components, such as memory die or portions thereof. Thus, the term "substrate" embraces, for example, circuit or "PC" boards, interposers, and other organic or non-organic supporting structures (which in some cases may also contain active or passive components). The following detailed description is, therefore, not to be taken in a limiting sense, and the scope of the various embodiments is defined only by the appended claims, along with the full scope of equivalents to which such claims are entitled.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

To better illustrate the method and apparatuses disclosed herein, a non-limiting list of embodiments is provided here:

Example 1 is a memory device, comprising: a buffer device coupled to a substrate, the buffer device including a host device interface, and a DRAM interface; one or more DRAM dies supported by the substrate; multiple wire bond interconnections between the DRAM interface of the buffer device and the one or more DRAM dies; and circuitry in the buffer device, configured to operate the host device interface at a first data speed, and to operate the DRAM interface at a second data speed, slower than the first data speed.

In Example 2, the memory device of Example 1 optionally includes 8 dies.

In Example 3, the memory device of Example 2 optionally includes 16 dies.

In Example 4, the memory device of any one or more of Examples 2-3 wherein the stack of DRAM dies includes stair-stepped stacked DRAM dies.

In Example 5, the memory device of Example 4 wherein the stack of DRAM dies includes more than one step direction within a single stack.

In Example 6, the memory device of any one or more of Examples 1-5 wherein two stacks of DRAM dies are coupled to the substrate.

In Example 7, the memory device of any one or more of Examples 1-6 wherein the buffer device is located at least partially underneath the one or more DRAM dies.

In Example 8, the memory device of any one or more of Examples 6-7 wherein the buffer device is located at least partially underneath a portion of each of the two stacks of DRAM dies.

In Example 9, the memory device of any one or more of Examples 1-8 optionally include solder balls on a backside of the substrate.

In Example 10, the memory device of any one or more of Examples 1-9 wherein the one or more DRAM dies comprises multiple DRAM dies in a stack of DRAM dies coupled to a single buffer device pin.

In Example 11, the memory device of any one or more of Examples 1-10 wherein the circuitry in the buffer device is configured to operate using a pulse amplitude modulation (PAM) protocol at the host device interface or the DRAM interface, or both.

Example 12 is a memory device, comprising: a buffer device coupled to a substrate, the buffer device including a host interface, and a DRAM interface; a stack of vertically aligned DRAM dies supported by the substrate; multiple through silicon via (TSV) interconnections coupling multiple die in the stack of vertically aligned DRAM dies with the buffer device; and circuitry in the buffer device, configured to operate the host interface at a first data speed, and to operate the DRAM interface at a second data speed, slower than the first data speed.

In Example 13, the memory device of Example 12 optionally includes 8 dies.

In Example 14, the memory device of Example 13 optionally includes 16 dies.

In Example 15, the memory device of any one or more of Examples 13-14 wherein the buffer device is located at least partially underneath the stack of vertically aligned DRAM dies.

In Example 16, the memory device of any one or more of Examples 13-15 wherein two stacks of vertically aligned DRAM dies are coupled to the substrate.

In Example 17, the memory device of Example 16 wherein the buffer die is located at least partially underneath a portion of each of the two stacks of vertically aligned DRAM dies.

Example 18 is a system, comprising: a processor coupled to a first substrate; a memory device coupled to the first substrate adjacent to the processor, the memory device including: a buffer device coupled to a second substrate, the buffer device including a host interface, and a DRAM interface; a stack of multiple DRAM dies coupled to the second substrate; multiple wire bond interconnections between the DRAM interface of the buffer device and the stack of DRAM dies; and circuitry in the buffer device, configured to operate the host interface at a first data speed, and to operate the DRAM interface at a second data speed, slower than the first data speed.

In Example 19, the system of Example 18 wherein the first substrate is a motherboard, and the memory device and the processor are both soldered to the motherboard with a ball grid array.

In Example 20, the system of Example 19 wherein the memory device is one multiple memory devices soldered to the motherboard adjacent to the processor.

In Example 21, the system of any one or more of Examples 18-20 wherein the multiple wire bond interconnections includes both command/address interconnections and data interconnections.

In Example 22, the system of any one or more of Examples 18-21 wherein the host interface includes a first number of data paths, and wherein the DRAM interface includes a second number of data paths; and wherein the second number of data paths is at least twice the first number of data paths.

In Example 23, the system of any one or more of Examples 18-22 wherein the host interface includes a third number of command/address paths; and wherein the DRAM interface includes a fourth number of command/address paths which is at least twice the third number of command/address paths.

In Example 24, the system of any one or more of Examples 22-23 wherein at least some data paths of the DRAM interface are in communication with only a single DRAM die.

In Example 25, the system of any one or more of Examples 22-24 wherein at least some data paths of the DRAM interface are in communication more than one DRAM die of the multiple stacked DRAM die.

In Example 26, the system of any one or more of Examples 23-25 wherein at least some command/address paths of the DRAM interface are in communication with a single bank of a single DRAM die.

In Example 27, the system of any one or more of Examples 23-26 wherein at least some command/address paths of the DRAM interface are in communication with multiple banks of the multiple stacked DRAM die.

In Example 28, the system of any one or more of Examples 18-27 wherein each DRAM die includes multiple 10 data stripes.

In Example 29, the system of Example 28 wherein each data stripe terminates to two opposing sides of a DRAM die.

In Example 30, the system of Example 29 wherein wire bonds from the second substrate extend to the multiple stacked DRAM dies from both the two opposing sides.

In Example 31, the system of Example 30 wherein at least some of the wire bonds are serially connected up the multiple stacked DRAM dies.

Example 32 is a method of operating a memory device, comprising: exchanging data between a processor and a buffer device at a first data speed; exchanging data between the buffer device and one or more DRAM dies at a second data speed, slower than the first data speed; wherein exchanging data between the buffer device and the one or more DRAM dies includes exchanging data through multiple wirebonds.

In Example 33, the method of Example 32 wherein exchanging data between the buffer device and the one or more DRAM dies includes exchanging using a pulse amplitude modulation (PAM) protocol.

In Example 34, the method of any one or more of Examples 32-33 wherein exchanging data between a processor and a buffer device includes exchanging data over a first number of data paths; and wherein exchanging data between the buffer device and the one or more DRAM dies includes exchanging data over a second number of data paths greater than the first number of data paths.

Example 35 is a method of operating a memory device, comprising: exchanging data between a processor and a buffer device at a first data speed; exchanging data between the buffer device and a stack of vertically aligned DRAM dies at a second speed, slower than the first speed; wherein exchanging data between the buffer device and the stack of vertically aligned DRAM dies includes exchanging data through multiple through silicon vias (TSVs) in the stack of vertically aligned DRAM dies.

In Example 36, the method of Example 35 wherein exchanging data between the buffer device and a stack of DRAM dies includes exchanging using a pulse amplitude modulation (PAM) protocol.

In Example 37, the method of any one or more of Examples 35-36 wherein exchanging data between a processor and a buffer device includes exchanging data over a first number of data paths; and wherein exchanging data between the buffer device and a stack of vertically aligned DRAM dies includes exchanging data over a second number of data paths greater than the first number of data paths.

Example 38 is a memory system, comprising: multiple memory die stacked above one another over a substrate; a buffer assembly, including, a host physical interface including connections for at least one memory channel, the connections for the memory channel including command/address connections and data connections, control logic mapping the connections for the at least one memory channel to at least two sub-channels, and DRAM physical interfaces for each sub-channel, each sub-channel physical interface including command/address connections and data connections; and interconnections between the DRAM physical interfaces for each sub-channel and one or more memory die of the multiple DRAM die.

In Example 39, the memory system of Example 38 wherein the stacked multiple memory die are each laterally offset with respect to at least one vertically adjacent memory die; and wherein individual memory die of the stacked multiple memory die are wire bonded to respective connections of the DRAM physical interfaces.

Example 40 is a method of operating a memory system, comprising: receiving command/address (CA) signals and corresponding data (DQ) signals for a first memory channel at a first memory interface; mapping the received CA signals and the corresponding DQ signals to at least first and second sub-channels; wherein each sub-channel DRAM interface carries a greater number of DQ signals than the first memory interface, and clocks the DQ signals at a slower speed than the first memory interface; and communicating the CA signals and DQ signals of each sub-channel DRAM interface through wirebond connections to one or more die in a stack of multiple memory die.

In Example 41, the method of Example 40 wherein the mapping is performed by a buffer assembly supported by a substrate, and wherein the stack of multiple memory die is supported by the substrate.

Example 42 is a memory system, comprising: multiple DRAM memory die stacked above one another over a substrate, wherein vertically adjacent memory die are laterally offset from at least one vertically adjacent die; a buffer assembly, including, a host physical interface including connections for multiple memory channels, the connections for each memory channel including command/address (CA) connections and data (DQ) connections, control logic mapping the connections for the at least one memory channel to at least two sub-channels, and DRAM physical interfaces for each sub-channel, each sub-channel DRAM physical interface including command/address connections and data connections, wherein the host physical interface includes a first number of DQ connections for the memory channels, and wherein the DRAM physical interfaces for the respective sub-channels includes a second number of DQ connections which is at least a multiple of the first number of DQ connections, and wherein the DQ connections of the sub-channel DRAM interfaces clock data at a speed less than a speed at which the host physical interface receives data; and wirebond interconnections between the DRAM physical interfaces for each sub-channel and one or more memory die of the multiple DRAM memory die.

In Example 43, the memory system of Example 42 wherein the DQ connections of the sub-channel DRAM interfaces clock data at an even fraction of the speed at which the host physical interface receives data.

In Example 44, the memory system of Example 43 wherein the sub-channel DRAM interfaces clock data at one half the speed at which the host physical interface receives data.

In Example 45, the memory system of any one or more of Examples 43-44 wherein the sub-channel DRAM interfaces clock data at one quarter the speed at which the host physical interface receives data.

In Example 46, the memory system of any one or more of Examples 42-45 wherein the CA connections of at least one sub-channel DRAM interface are coupled to multiple banks of DRAM memory in the stacked multiple DRAM memory die.

In Example 47, the memory system of Example 46 wherein the CA connections of the at least one sub-channel DRAM interface are coupled to banks in different DRAM memory die.

In Example 48, the memory system of any one or more of Examples 42-47 wherein at least one of the DRAM memory die includes a redistribution layer (RDL), the RDL comprising wirebond pads.

In Example 49, the memory system of Example 48 wherein the wirebond pads are located adjacent an edge of the at least a first DRAM memory die, and wherein the wirebond pads of the first DRAM memory die are accessible as a result of the lateral offset of at least one vertically adjacent DRAM memory die relative to the first DRAM memory die.

Example 50 is a memory system, comprising: at least one memory die; a buffer coupled to the at least one memory die, including, a host physical interface including pins for a memory channel, the pins for including command/address pins and data pins, and wherein the data pins include multiple ECC pins and multiple parity pins; control logic mapping the data pins for the at least one memory channel at the host physical interface to at least two memory physical interfaces, each memory physical interface including multiple data pins, including multiple ECC pins and multiple parity pins; and Interconnections between the memory physical interfaces and one or more memory die of the at least one memory die, wherein the memory physical interface data pins are mapped between multiple regions of the at least one memory die, and wherein the number of the multiple regions is divisible by 10.

In Example 51, the memory system of Example 50 wherein the host physical interface and the memory physical interfaces each include multiple pins for parity bits.

In Example 52, the memory system of any one or more of Examples 50-51 wherein the host physical interface includes a first number of data pins; and wherein each sub-channel physical connection includes a second number of data pins which is at least twice the first number of data pins.

In Example 53, the memory system of Example 52 wherein the second number of data pins is four times the first number of data pins.

In Example 54, the memory system of any one or more of Examples 50-53 wherein each memory physical interface is a greater number of command/address pins than the host physical interface.

In Example 55, the memory system of any one or more of Examples 50-54 wherein the at least one memory device comprises a DRAM memory device; and wherein each memory physical interface is a DRAM physical interface.

In Example 56, the memory system of any one or more of Examples 50-55 optionally include regions of the at least one memory device each comprise a sub-array.

In Example 57, the memory system of Example 56 wherein each sub-array comprises multiple array mats.

In Example 58, the memory system of any one or more of Examples 56-57 optionally include regions are distributed across at least two memory devices.

In Example 59, the memory system of any one or more of Examples 56-58 optionally include regions are distributed across multiple banks of a memory device.

Example 60 is a memory system, comprising: at least one memory die; a buffer coupled to the at least one memory die, the buffer configured to reallocate data pins of a first interface operable at a first data rate, to multiple memory interfaces, the memory interfaces operable at a second data rate slower than the first data rate, the buffer further configured to reallocate groups of the data pins of the first interface to at least 10 slices of the at least one memory die.

In Example 61, the memory system of Example 60 wherein the buffer is further configured to reallocate each data pin of the first interface to at least two data pins of the multiple memory interfaces.

In Example 62, the memory system of any one or more of Examples 60-61 wherein the buffer is further configured to reallocate control/address pins of the first interface to the multiple memory interfaces.

In Example 63, the memory system of Example 62 wherein the buffer is further configured to reallocate each control/address pin of the first interface to multiple pins in the multiple memory interfaces; and wherein the control/address pins of the first interface are operable at a third data rate, and the control/address pins of the multiple memory interfaces are operable a fourth data rate.

In Example 64, the memory system of Example 63 wherein the first data rate is the same as the third data rate; and wherein the second data rate is the same as the fourth data rate.

In Example 65, the memory system of any one or more of Examples 60-64 wherein the multiple data pins of the first interface comprise multiple data pins coupled to carry data, multiple data pins coupled to carry ECC bits, and multiple data pins coupled to carry parity bits.

In Example 66, the memory system of Example 65 optionally includes slices of the at least one memory die comprises multiple array mats.

In Example 67, the memory system of any one or more of Examples 60-66 optionally include slices are coupled to common global word lines.

In Example 68, the memory system of any one or more of Examples 66-67 optionally include slices includes local word lines operable independently of word lines in a physically adjacent array mat.

In Example 69, the memory system of Example 68 wherein the local word lines of the array mats are operable through use of respective global word lines.

In Example 70, the memory system of any one or more of Examples 62-69 optionally include sub-channel interfaces, and wherein each sub-channel interface is connected to a respective slice of the at least one memory die.

In Example 71, the memory system of any one or more of Examples 60-70 optionally include slices are located in at least two memory devices.

In Example 72, the memory system of any one or more of Examples 60-71 optionally include slices are located in at least two ranks of memory die.

In Example 73, the memory system of any one or more of Examples 60-72 optionally include slices are located in multiple banks of a memory die.

In Example 74, the memory system of any one or more of Examples 60-73 wherein the at least one memory die comprises a stack of at least two memory die.

In Example 75, the memory system of any one or more of Examples 60-74 wherein the at least one memory die comprises a DRAM memory die.

In Example 76, the memory system of any one or more of Examples 70-75 wherein the at least one memory die comprises multiple DRAM memory die.

In Example 77, the memory system of any one or more of Examples 70-76 wherein each sub-channel interface is coupled to at least two slices of the at least one memory die.

In Example 78, the memory system of Example 77 wherein the at least two slices coupled to each sub-channel interface are located in different banks of a memory die.

In Example 79, the memory system of any one or more of Examples 60-78 wherein the buffer comprises controller and switching logic operable to reallocate the pins of the first interface.

In Example 80, the memory system of Example 79 wherein the buffer further comprises row address select (RAS) logic.

In Example 81, the memory system of Example 80 wherein the buffer further comprises a built-in self test (BIST) engine.

Example 82 is a method of operating a memory system, comprising: receiving data and control/address signals at a first interface of a buffer structure, and at a first data rate; mapping data pins of the first interface to multiple memory sub-channel interfaces, the memory sub-channel interfaces operable at a second data rate slower than the first data rate; and communicating signals from each sub-channel interface to at least one slice of a memory device.

In Example 83, the method of Example 82 optionally includes sub-channel interfaces.

In Example 84, the method of any one or more of Examples 82-83 wherein mapping data pins of the first interface to multiple memory sub-channel interfaces comprises mapping each data pin of the first interface to at least two data pins of a memory sub-channel interface.

In Example 85, the method of any one or more of Examples 82-84 wherein the first interface comprises multiple data pins coupled to carry data, multiple data pins coupled to carry ECC bits, and multiple data pins coupled to carry parity bits.

In Example 86, the method of any one or more of Examples 83-85 optionally include slices of a memory system and were in each slice of the memory system comprises multiple array mats.

In Example 87, the method of any one or more of Examples 83-86 optionally include slices are coupled to a common global word line.

In Example 88, the method of any one or more of Examples 86-87 optionally include slices includes local word lines operable independently of word lines in a physically adjacent array mat.

Example 89 is a method of operating a memory system, comprising: receiving signals at a host physical interface, the host physical interface including command/address pins and data pins (DQs), and wherein the DQs include multiple ECC pins and multiple parity pins; mapping the DQs of the host physical interface to at least two sub-channel memory interfaces, each sub-channel memory interface including command/address pins and DQs, including multiple ECC pins and multiple parity pins; and communicating signals from the sub-channel memory interfaces to respective regions located in one or more memory die, wherein the number of the regions receiving the signals is divisible by 10.

In Example 90, the method of Example 89 wherein each of the respective regions located in one or more memory die is a sub-array of a memory die.

In Example 91, the method of Example 90 wherein each sub-array includes multiple array mats.

In Example 92, the method of Example 91 wherein communicating signals from the sub-channel memory interfaces to respective regions comprises communicating signals to multiple array mats within each sub-array, and wherein the signals are communicated to a number of array mats which is a multiple of 10.

Example 93 is a memory system, comprising: at least one memory die; a buffer coupled to the at least one memory die, the buffer configured to reallocate data pins of a first interface operable at a first data rate, to multiple memory interfaces, the memory interfaces operable at a second data rate slower than the first data rate, the buffer further configured to reallocate groups of the data pins of the first interface to at least nine slices of the at least one memory die.

In Example 94, the memory system of Example 93 wherein the buffer is further configured to reallocate each data pin of the first interface to at least two data pins of the multiple memory interfaces.

In Example 95, the memory system of any one or more of Examples 93-94 wherein the buffer is further configured to reallocate control/address pins of the first interface to the multiple memory interfaces.

In Example 96, the memory system of Example 95 wherein the buffer is further configured to reallocate each control/address pin of the first interface to multiple pins in the multiple memory interfaces; and wherein the control/address pins of the first interface are operable at a third data rate, and the control/address pins of the multiple memory interfaces are operable a fourth data rate.

In Example 97, the memory system of Example 96 wherein the first data rate and the third data rate are the same; and wherein the second data rate and the fourth data rate are the same.

In Example 98, the memory system of any one or more of Examples 93-97 wherein the multiple data pins of the first interface comprise multiple data pins coupled to carry data, multiple data pins coupled to carry ECC bits, and multiple data pins coupled to carry parity bits.

In Example 99, the memory system of Example 98 wherein each slice of the at least nine slices of the at least one memory die comprises multiple array mats.

In Example 100, the memory system of any one or more of Examples 98-99 wherein multiple array mats of the at least nine slices are coupled to common global word lines.

In Example 101, the memory system of any one or more of Examples 99-100 wherein each array mat within the at least nine slices includes local word lines operable independently of word lines in a physically adjacent array mat.

In Example 102, the memory system of Example 101 wherein the local word lines of the array mats are operable through use of respective global word lines.

In Example 103, the memory system of any one or more of Examples 95-102 wherein the multiple memory interfaces comprise at least nine sub-channel interfaces, and wherein each sub-channel interface is connected to a respective slice of the at least one memory die.

In Example 104, the memory system of any one or more of Examples 93-103 wherein the at least nine slices are located in at least two memory devices.

In Example 105, the memory system of any one or more of Examples 93-104 wherein the at least nine slices are located in at least two ranks of memory devices.

In Example 106, the memory system of any one or more of Examples 93-105 wherein the at least nine slices are located at least two banks of a memory device.

In Example 107, the memory system of any one or more of Examples 93-106 wherein the at least one memory die comprises a stack of at least two memory die.

In Example 108, the memory system of any one or more of Examples 93-107 wherein the at least one memory die comprises a DRAM memory die.

In Example 109, the memory system of any one or more of Examples 93-108 wherein the at least one memory die comprises multiple DRAM memory die.

In Example 110, the memory system of any one or more of Examples 103-109 wherein each sub-channel interface is coupled to at least two slices of the at least one memory die.

In Example 111, the memory system of Example 110 wherein the at least two slices coupled to each sub-channel interface are located in different banks of a memory device.

In Example 112, the memory system of any one or more of Examples 93-111 wherein the buffer comprises controller and switching logic operable to reallocate the pins of the first interface.

In Example 113, the memory system of Example 112 wherein the buffer further comprises row address select (RAS) logic.

In Example 114, the memory system of any one or more of Examples 112-113 wherein the buffer further comprises a built-in self test (BIST) engine.

Example 115 is a method of operating a memory system, comprising: receiving data and control/address signals at a first interface of a buffer structure, and at a first data rate; mapping data pins of the first interface to multiple memory sub-channel interfaces, the memory sub-channel interfaces operable at a second data rate slower than the first data rate; and communicating signals from each sub-channel interface to at least one slice of a memory device.

In Example 116, the method of Example 115 wherein mapping data pins of the first interface to multiple memory sub-channel interfaces comprises mapping groups of the data pins of the first interface to at least nine sub-channel interfaces.

In Example 117, the method of any one or more of Examples 115-116 wherein mapping data pins of the first interface to multiple memory sub-channel interfaces comprises mapping each data pin of the first interface to at least two data pins of a memory sub-channel interface.

In Example 118, the method of any one or more of Examples 115-117 wherein the first interface comprises multiple data pins coupled to carry data, and multiple data pins coupled to carry parity bits.

In Example 119, the method of any one or more of Examples 115-118 wherein each of the memory sub-channel interfaces extends to a respective slice of least nine slices of a memory array, and wherein each slice of the memory array comprises multiple array mats.

In Example 120, the method of any one or more of Examples 116-119 wherein multiple slices of the at least nine slices are coupled to a common global word line.

In Example 121, the method of any one or more of Examples 119-120 wherein each array mat within the at least nine slices includes local word lines operable independently of word lines in a physically adjacent array mat.

Example 122 is a method of operating a memory system, comprising: receiving signals at a host physical interface, the host physical interface including command/address pins and data pins (DQs); mapping the DQs of the host physical interface to at least two sub-channel memory interfaces, each sub-channel memory interface including command/address pins and DQs; and communicating signals from the sub-channel memory interfaces to respective regions located in one or more memory die, wherein a number of the multiple regions receiving the signals is divisible by nine.

In Example 123, the method of Example 122 wherein each of the respective regions located in one or more memory die is a sub-array of a memory die.

In Example 124, the method of Example 123 wherein each sub-array includes multiple array mats.

In Example 125, the method of Example 124 wherein communicating signals from the sub-channel memory interfaces to respective regions comprises communicating signals to multiple array mats within each sub-array, and wherein the signals are communicated to a number of array mats which is a multiple of nine.

Example 126 is a memory system, comprising: multiple memory die supported by a substrate; a buffer assembly electrically coupled to the multiple memory die, including, a host memory channel interface including command/address connections and data connections, control logic mapping the data connections of the at least one memory channel to at least two memory sub-channel interfaces coupled to the memory devices, including mapping each host data connection to at least two data connections at a memory sub-channel interface; wherein the memory sub-channel data connections are operable to transfer data at a slower rate than data connections of the host memory channel interface.

In Example 127, the system of Example 126 wherein the buffer assembly comprises a buffer die stacked with at least one memory device.

In Example 128, the system of Example 127 wherein multiple memory devices are stacked with the buffer die.

In Example 129, the system of any one or more of Examples 126-128 wherein the memory system forms a portion of a memory module.

In Example 130, the system of Example 129 wherein the memory module is a dual-inline memory module (DIMM).

In Example 131, the system of any one or more of Examples 126-130 wherein the multiple memory devices comprise multiple DRAM memory devices.

In Example 132, the system of any one or more of Examples 126-131 wherein the data connections include ECC/parity connections.

In Example 133, memory devices or systems of any of Examples 1-39 and 93-114 may be modified with structures and functionality of other of such Examples.

In Example 134, the memory devices or systems of any of Examples 1-39 and 93-114 may be configured or adapted to perform the methods of any of Examples 32-37, 40-41, 82-92, 42-81, or 115-125.

In Example 135 the methods of any of Examples 32-37, 40-41, 82-92, 42-81, or 115-125 may be modified to include operations of other of such Examples.

In Example 136, the methods of any of Examples 32-37, 40-41, 82-92, 42-81, or 115-125 may be implemented through one or more of the devices of any of Examples 1-39 and 93-114.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic system comprising:
a processor;
a plurality of stacked dynamic random access memory (DRAM) die; and
a buffer die coupled to the processor and the plurality of stacked DRAM die, the buffer die comprising:
a processor device interface configured to communicate data with the processor at a first data transfer rate;
a first sub-channel DRAM interface coupled to the processor device interface and a first DRAM die of the plurality of stacked DRAM die, wherein the first sub-channel DRAM interface is configured to communicate data with the first DRAM die at a second data transfer rate; and
a second sub-channel DRAM interface coupled to the processor device interface and a second DRAM die of the plurality of stacked DRAM die;
wherein the buffer die is configured to map data between the processor and the first DRAM die and the second DRAM die of the plurality of stacked DRAM die.

2. The electronic system of claim 1, wherein the buffer die comprises control logic configured to map the data by allocating a first portion of data connections of the processor device interface with the processor to the first sub-channel DRAM interface and allocating a second portion of the data connections of the processor device interface with the processor to the first sub-channel DRAM interface.

3. The electronic system of claim 1, wherein the first data transfer rate is higher than the second data transfer rate.

4. The electronic system of claim 1, wherein a throughput of the processor device interface for communicating data with the processor is equal to a throughput of the first sub-channel DRAM interface and the second sub-channel DRAM interface for communicating data with the first DRAM die and the second DRAM die.

5. The electronic system of claim 1, wherein the plurality of stacked DRAM die comprises vertically aligned stacked DRAM die.

6. The electronic system of claim 5, wherein the buffer die is coupled to the processor via a plurality of solder interconnections of a substrate, wherein the buffer die, the plurality of stacked DRAM die, the processor, or any combination thereof are coupled to the substrate.

7. The electronic system of claim 5, comprising a plurality of through silicon vias (TSVs) coupling the plurality of stacked DRAM die to the buffer die.

8. The electronic system of claim 1, wherein the plurality of stacked DRAM die comprises stair-stepped stacked DRAM die having one or more than one step directions within a single stack.

9. The electronic system of claim 8, wherein a single wire bond is coupled to the first sub-channel DRAM interface and is serially coupled to a sub-plurality of the plurality of stacked DRAM die.

10. The electronic system of claim 8, comprising a plurality of wire bonds, wherein each wire bond of the plurality of wire bonds is coupled to the first sub-channel DRAM interface and a respective DRAM die of the plurality of stacked DRAM die.

11. A memory system comprising:
a plurality of stacked dynamic random access memory (DRAM) die; and
a buffer die coupled to the plurality of stacked DRAM die and configured to couple to a processor, the buffer die comprising:
a processor device interface configured to communicate data with the processor at a first data transfer rate;
a first sub-channel DRAM interface coupled to the processor device interface and a first DRAM die of the plurality of stacked DRAM die, wherein the first sub-channel DRAM interface is configured to communicate data with the first DRAM die at a second data transfer rate; and
a second sub-channel DRAM interface coupled to the processor device interface and a second DRAM die of the plurality of stacked DRAM die;
wherein the buffer die is configured to map data between the processor and the first DRAM die and the second DRAM die of the plurality of stacked DRAM die.

12. The memory system of claim 11, wherein the buffer die comprises control logic configured to map the data by allocating a first portion of data connections of the processor device interface with the processor to the first sub-channel DRAM interface and allocating a second portion of the data connections of the processor device interface with the processor to the first sub-channel DRAM interface.

13. The memory system of claim 11, wherein the first data transfer rate is higher than the second data transfer rate, and a throughput of the processor device interface for communicating data with the processor is equal to a throughput of the first sub-channel DRAM interface and the second sub-channel DRAM interface for communicating data with the first DRAM die and the second DRAM die.

14. The memory system of claim 11, wherein the plurality of stacked DRAM die comprises vertically aligned stacked DRAM die or stair-stepped stacked DRAM die having one or more than one step directions within a single stack.

15. The memory system of claim 11, wherein at least a portion of the buffer die is disposed between the plurality of stacked DRAM die and a substrate.

16. A memory system comprising:
a buffer die configured to couple to a processor; and
a plurality of stacked dynamic random access memory (DRAM) die coupled to the buffer die, wherein the plurality of stacked DRAM die comprises one of:
vertically aligned stacked DRAM die comprising a plurality of through silicon vias (TSVs) coupling the plurality of stacked DRAM die to the buffer die; or
stair-stepped stacked DRAM die having one or more than one step directions within a single stack, wherein a first wire bond is coupled to the buffer die and a first DRAM die of the plurality of stacked DRAM die.

17. The memory system of claim 16, wherein the buffer die comprises;

a processor device interface configured to communicate data with the processor at a first data transfer rate;

a first sub-channel DRAM interface coupled to the processor device interface and a first DRAM die of the plurality of stacked DRAM die, wherein the first sub-channel DRAM interface is configured to communicate data with the first DRAM die at a second data transfer rate; and a second sub-channel DRAM interface coupled to the processor device interface and a second DRAM die of the plurality of stacked DRAM die.

18. The memory system of claim 17, wherein the buffer die is configured to map data between the processor and the first DRAM die and the second DRAM die of the plurality of stacked DRAM die.

19. The memory system of claim 16, wherein the first wire bond is coupled to the buffer die and is serially coupled to a sub-plurality of the plurality of stacked DRAM die, wherein the sub-plurality of the plurality of stacked DRAM die comprises the first DRAM die.

20. The memory system of claim 16, comprising a plurality of wire bonds comprising the first wire bond, wherein each wire bond of the plurality of wire bonds is coupled to buffer die and a respective DRAM die of the plurality of stacked DRAM die.

* * * * *